(12) United States Patent
Yamaji

(10) Patent No.: US 12,302,614 B2
(45) Date of Patent: May 13, 2025

(54) SEMICONDUCTOR DEVICE

(71) Applicant: FUJI ELECTRIC CO., LTD., Kawasaki (JP)

(72) Inventor: Masaharu Yamaji, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 673 days.

(21) Appl. No.: 17/511,688

(22) Filed: Oct. 27, 2021

(65) Prior Publication Data

US 2022/0190107 A1    Jun. 16, 2022

(30) Foreign Application Priority Data

Dec. 15, 2020   (JP) .................................. 2020-207664
Jun. 10, 2021   (JP) .................................. 2021-097198

(51) Int. Cl.
*H10D 62/10*     (2025.01)
*H10D 12/00*     (2025.01)
(Continued)

(52) U.S. Cl.
CPC ......... *H10D 62/107* (2025.01); *H10D 12/411* (2025.01); *H10D 62/393* (2025.01);
(Continued)

(58) Field of Classification Search
CPC . H01L 21/761; H01L 27/0629; H01L 27/088; H01L 29/0623; H01L 29/0692; H01L 29/0878; H01L 29/1095; H01L 29/41766; H01L 29/42304; H01L 29/42368; H01L 29/7816; H10D 12/441; H10D 62/107; H10D 62/393;
(Continued)

(56) References Cited

U.S. PATENT DOCUMENTS 5,894,156 A    4/1999    Terashima et al.
6,774,408 B2   8/2004    Ninomiya
(Continued)

FOREIGN PATENT DOCUMENTS

JP    5326944 A    12/1993
JP    8102536 A    4/1996
(Continued)

OTHER PUBLICATIONS

Japanese Office Action issued in counterpart Japanese Application No. 2021-097198 dated Feb. 4, 2025.

*Primary Examiner* — Fazli Erdem

(57) ABSTRACT

A semiconductor device includes: a well region of a second conductivity-type deposited on a surface layer of a semiconductor layer of a first conductivity-type; a breakdown voltage region of the second conductivity-type arranged to surround the well region and having a lower impurity concentration than the well region; a base region of the first conductivity-type arranged to surround the breakdown voltage region; a carrier supply region of the second conductivity-type arranged on a surface layer of the base region and serving as a level shifter; and a carrier reception region of the level shifter, wherein the carrier reception region is formed of a first universal contact region including a region of the first conductivity-type and a region of the second conductivity-type arranged in contact with each other.

18 Claims, 25 Drawing Sheets

(51) Int. Cl.
  *H10D 62/17* (2025.01)
  *H10D 64/27* (2025.01)
  *H10D 84/80* (2025.01)
  *H10D 84/85* (2025.01)
(52) U.S. Cl.
  CPC ......... *H10D 64/281* (2025.01); *H10D 84/811* (2025.01); *H10D 84/854* (2025.01); *H10D 84/856* (2025.01)
(58) Field of Classification Search
  CPC .. H10D 64/281; H10D 84/811; H10D 84/854; H10D 84/856
  USPC ............................................. 257/288
  See application file for complete search history.

(56) References Cited

U.S. PATENT DOCUMENTS

| | | | |
|---|---|---|---|
| 8,633,563 B2 | 1/2014 | Yamaji | |
| 8,860,172 B2 | 10/2014 | Yamaji | |
| 9,722,019 B2 | 8/2017 | Yamaji | |
| 10,135,445 B2 | 11/2018 | Yamaji | |
| 10,374,080 B2 | 8/2019 | Ohse et al. | |
| 10,763,854 B2 | 9/2020 | Tanaka | |
| 2003/0003637 A1 | 1/2003 | Ninomiya | |
| 2013/0127524 A1* | 5/2013 | Yamaji | H01L 27/0921 327/535 |
| 2014/0191281 A1 | 7/2014 | Yamaji | |
| 2015/0236013 A1 | 8/2015 | Yamaji | |
| 2016/0308534 A1 | 10/2016 | Yamaji | |
| 2018/0308975 A1 | 10/2018 | Ohse et al. | |
| 2020/0177180 A1 | 6/2020 | Tanaka | |
| 2020/0328203 A1* | 10/2020 | Yamaji | H01L 27/0255 |

FOREIGN PATENT DOCUMENTS

| | | |
|---|---|---|
| JP | 3917211 B2 | 2/2007 |
| JP | 3941206 B2 | 4/2007 |
| JP | 4225711 B2 | 12/2008 |
| JP | 4935037 B2 | 3/2012 |
| JP | 5099282 B1 | 10/2012 |
| JP | 5720792 B2 | 5/2015 |
| JP | 2015173255 A | 10/2015 |
| JP | 2018182235 A | 11/2018 |
| JP | 202088287 A | 6/2020 |
| WO | 2012/124677 A1 | 9/2012 |
| WO | 2016/002508 A1 | 1/2016 |

* cited by examiner

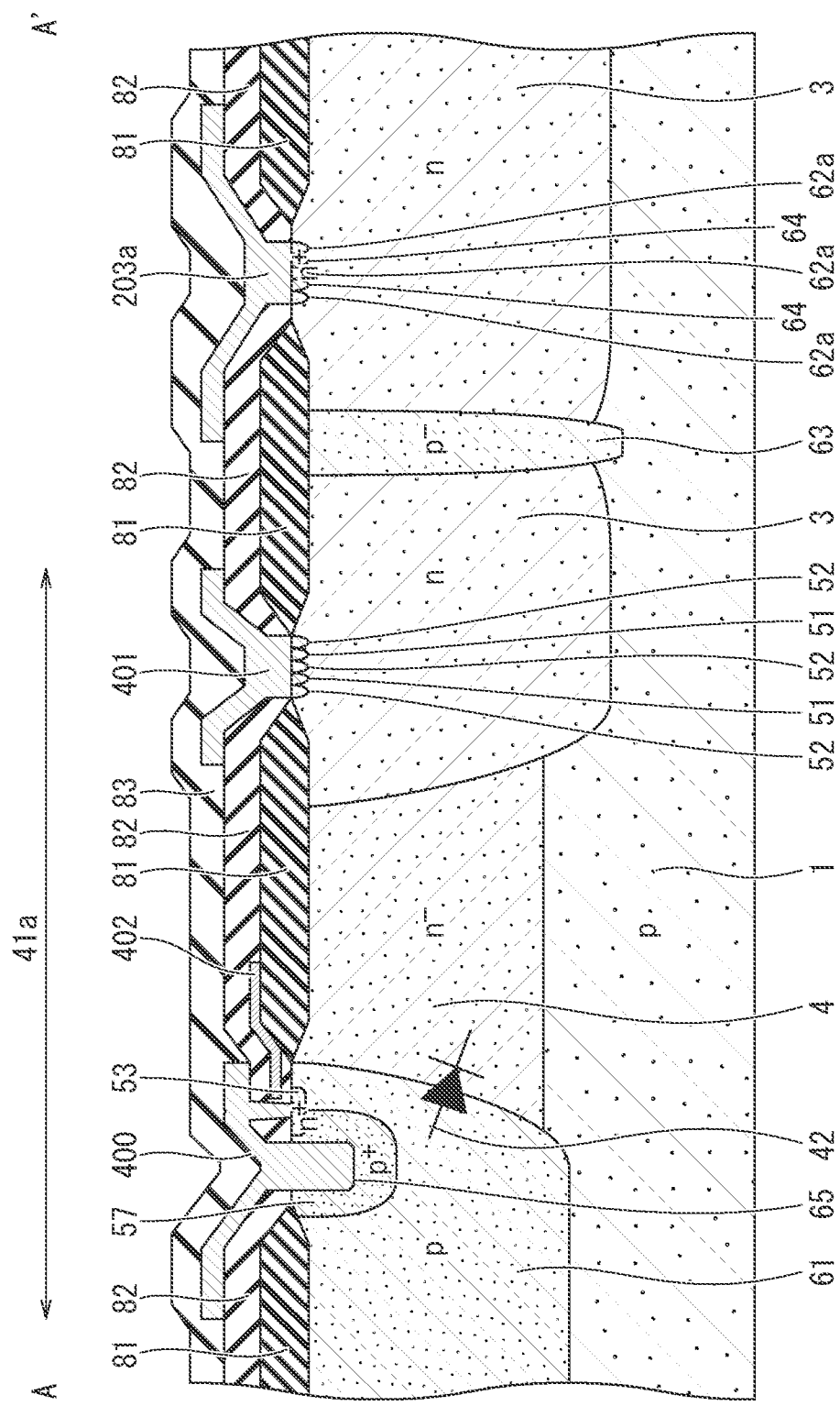

SEMICONDUCTOR DEVICE

CROSS-REFERENCE TO RELATED APPLICATION

This application claims benefit of priority under 35 USC 119 based on Japanese Patent Application No. 2020-207664 filed on Dec. 15, 2020, and Japanese Patent Application No. 2021-097198 filed on Jun. 10, 2021, the entire contents of which are incorporated by references herein.

BACKGROUND

1. Field of the Invention

The present invention relates to semiconductor devices, and more particularly, to a high-voltage integrated circuit (HVIC) used for transmitting drive signals for turning on/off a gate of a switching power device in a pulse width modulation (PWM) inverter, a switching power supply, and the like.

2. Description of the Related Art

A HVIC of an element-isolation system by use of high-voltage junction is typically used as a means for driving a switching power device implementing an upper arm of a bridge circuit for power inversion (DC-AC conversion) such as a PWM inverter. The HVIC can exhibit high performance including a means of detecting overcurrent or temperature in case of abnormal circumstances of the switching power device. The HVIC, which does not use potential isolation by a transformer or a photocoupler, can contribute to a reduction in size and cost of a power supply system.

A power conversion system in combination with a half bridge circuit of a switching power device is widely used in various technical fields, such as an inverter for motor control, a power source for amusement equipment and a liquid crystal panel, and a household inverter for an air conditioner and a lighting apparatus, for example. The motor and the lighting apparatus of this type cause an inductance load (L-load) and thus have an influence of parasitic inductance components and the like due to a wiring layer on a printed substrate or a cable extending to the L-load.

A potential at a Vs terminal or a potential at a H-VDD terminal as a reference potential on a high-potential side of a high-side circuit part included in the HVIC is shifted toward a negative potential with respect to a ground potential (GND potential) upon switching when a switching power device of an upper arm is turned off or when a switching power device of a lower arm is turned on. The shift toward the negative potential (negative surge voltage) causes an error operation or a latch-up in the high-side circuit part, which may lead to damage to the HVIC accordingly.

To deal with such a negative surge voltage, JP 5099282 B discloses a chip layout configuration for preventing an error operation or damage to a HVIC itself that drives a power device having a half-bridge structure. JP 5099282 B discloses a universal contact region used as a pickup region set to a potential on a high-potential side of a power supply of a high-side circuit part arranged at an outer circumference of the high-side circuit part, so as to reduce the number of carriers flowing into a low-side circuit part to avoid an error operation or damage due to a latch-up in a logic unit of the low-side circuit part. JP 4935037 B discloses $n^+/p^+$ short-circuit regions provided in an anode and a cathode in a high-voltage horizontal diode so as to promote the extraction of minority carriers.

To promote a reduction in size of chips, recent HVICs of self-isolation type or junction-isolation type typically use a self-shielding system in which a level shifter including a high-voltage n-channel MOSFET and a high-voltage junction termination (HVJT) region are integrated together. A configuration is disclosed in which a $p^-$-type opening is provided in a breakdown voltage region surrounding a high-side circuit part in order to increase parasitic resistance components in a drain and a H-VDD potential region of a level shifter so as to achieve a stable level-shift circuit operation by the self-shielding system (refer to JP 3941206 B, JP 5720792 B, and JP 2015-173255 A). As illustrated in FIG. 15 in JP 3941206 B, the configuration in which the high-voltage n-channel MOSFET is integrated with the HVJT without use of the $p^-$-type opening also belongs to the self-shielding system described above. JP 3917211 B discloses a divided RESURF technique in which a circumference of a level shifter is divided by junction isolation by a $p^-$-type layer so as to completely eliminate parasitic resistance components in a drain and a H-VDD potential region of the level shifter. The configuration disclosed in JP 3917211 B also belongs to the self-shielding system described above.

JP H08-102536 A discloses that at least a part of a low-concentration layer in an outer circumferential region has a larger thickness than a low-concentration layer in a cell region so as to improve soft recovery properties to use a diode equipped with a power MOSFET as a protection diode of the MOSFET. JP 2020-088287 A discloses that an effective channel defined by a width of a base region in a part overlapping with a control electrode of a level shifter is wider than a drain region measured along the same direction as the effective channel so as to improve a trade-off between heat generation of the level shifter and a delay in transmission time.

JP 4225711 B discloses that a channel layer is provided on a side wall of a trench in a trench MOSFET so as to improve a short-circuit tolerance.

JP 2018-182235 A discloses a MOSFET having a trench contact structure equipped with a Schottky barrier diode (SBD) with Schottky contact on a side wall of a trench.

JP H05-326944 A discloses that a groove is provided in a source region to communicate with a silicon substrate so as to electrically connect a source electrode to the source region and the silicon substrate to shorten the source region, and a lower part of the source region is directly connected to the source electrode so as to reduce resistance components at the lower part of the source region.

As disclosed in JP 5099282 B, electrons as minority carriers enter a p-region from an $n^-$-region (the H-VDD side) of a parasitic p-n diode of the HVJT, and the electrons further flow into the $n^-$-region of the low-side circuit part via the p-region when a negative surge voltage is applied via the H-VDD terminal. The electrons entering the p-region present in the middle of the moving path of the electrons flowing from the $n^-$-region (the H-VDD) to the $n^-$-region (the low-side circuit) are partly trapped in an $n^+$-region having a higher junction barrier (by about 0.6 volts) and having a lower electron energy barrier than the p-region, and are extracted in the anode electrode. The number of the electrons flowing into the $n^-$-region (toward the low-side circuit) is thus decreased, so as to avoid an error operation of the logic or damage due to the latch-up in the low-side circuit part. In addition, the number of holes released from a p$^+$-region (the GND side) to the p-region is decreased due to the n$^+$-region present adjacent to the p$^+$-region (the GND side). This also decreases the number of holes entering from the p-region to the n$^-$-region in the parasitic p-n diode, so as to avoid an error operation of the logic or damage due to the latch-up in the high-side circuit part.

In the HVIC of the self-shielding system in which the high-voltage n-channel MOSFET is provided in the HVJT, a current in the forward direction starts flowing through the parasitic diode of the HVJT, and also starts flowing through a body diode of the high-voltage n-channel MOSFET when the negative surge voltage is applied to the H-VDD terminal. The p$^-$-type opening present between the drain of the high-voltage n-channel MOSFET and the H-VDD potential region is then led to have a higher potential than the n-region, which crushes the barrier to loss the function as the junction isolation region. This leads excessive electron carriers entering from the drain of the high-voltage n-channel MOSFET and the H-VDD potential region via the p$^-$-type opening to flow into the p$^+$-region of the GND potential, and further leads excessive hole carriers to flow into the drain region from the p$^+$-region of the GND potential.

When the VS potential is recovered from the negative surge state, the body diode of the high-voltage n-channel MOSFET is led to an inversion recovery state, and an excessive amount of inversion recovery current Irr flows. The excessive amount of inversion recovery current Irr (hole current) induces a voltage drop of 0.6 volts or greater in the base region under the source region of the high-voltage n-channel MOSFET, and leads a parasitic npn bipolar to start operating. The operation of the parasitic npn bipolar not only drops the potential of the drain for a certain period of time to impede the reception of an input signal (signal ignoring), but also can cause an error operation of the level-shift circuit or damage by thermal runaway in a high-temperature state.

The universal electrode including the p-region and the n-region arranged adjacent to each other as disclosed in JP 5099282 B and JP 4935037 B can be used only in the high-voltage diode region, but cannot avoid the operation of the parasitic npn bipolar transistor of the high-voltage MOSFET using the inversion recovery current Irr described above as a trigger.

SUMMARY

In view of the foregoing problems, the present invention provides a semiconductor device that is a HVIC of a self-shielding system having high noise resistance and capable of suppressing an operation of a parasitic bipolar transistor of a high-voltage MOSFET as a level shifter.

An aspect of the present invention inheres in a semiconductor device including a high-potential-side circuit region, a high-voltage junction termination structure arranged along a circumference of the high-potential-side circuit region, and a low-potential-side circuit region arranged at a circumference of the high-potential-side circuit region via the high-voltage junction termination structure that are integrated in a single semiconductor chip, the semiconductor device including: a semiconductor layer of a first conductivity-type; a well region of a second conductivity-type located in the high-potential-side circuit region and deposited on a surface layer of the semiconductor layer; a breakdown voltage region of the second conductivity-type arranged in contact with the well region to surround the well region and having a lower impurity concentration than the well region; a base region of the first conductivity-type arranged in contact with the breakdown voltage region to surround the breakdown voltage region; a carrier supply region of the second conductivity-type arranged on a surface layer of the base region and serving as a level shifter included in a level-shift circuit that transfers signals between the low-potential-side circuit region and the high-potential-side circuit region; and a carrier reception region of the level shifter arranged on a surface layer of the well region or the breakdown voltage region, wherein the carrier reception region is formed of a first universal contact region including a region of the first conductivity-type and a region of the second conductivity-type arranged in contact with each other.

Another aspect of the present invention inheres in a semiconductor device including a high-potential-side circuit region, a high-voltage junction termination structure arranged along a circumference of the high-potential-side circuit region, and a low-potential-side circuit region arranged at a circumference of the high-potential-side circuit region via the high-voltage junction termination structure that are integrated in a single semiconductor chip, the semiconductor device including: a semiconductor layer of a first conductivity-type; a well region of a second conductivity-type located in the high-potential-side circuit region and deposited on a surface layer of the semiconductor layer; a breakdown voltage region of the second conductivity-type arranged in contact with the well region to surround the well region and having a lower impurity concentration than the well region; a base region of the first conductivity-type arranged in contact with the breakdown voltage region to surround the breakdown voltage region; a carrier supply region of the second conductivity-type arranged on a surface layer of the base region and serving as a level shifter included in a level-shift circuit that transfers signals between the low-potential-side circuit region and the high-potential-side circuit region; a carrier reception region of the level shifter arranged on a surface layer of the well region or the breakdown voltage region; and a plurality of pickup regions arranged on the surface layer of the well region, wherein one of the pickup regions is formed of a universal contact region including a region of the first conductivity-type and a region of the second conductivity-type arranged in contact with each other.

Further aspect of the present invention inheres in a semiconductor device including a high-potential-side circuit region, a high-voltage junction termination structure arranged along a circumference of the high-potential-side circuit region, and a low-potential-side circuit region arranged at a circumference of the high-potential-side circuit region via the high-voltage junction termination structure that are integrated in a single semiconductor chip, the semiconductor device including: a semiconductor layer of a first conductivity-type; a well region of a second conductivity-type located in the high-potential-side circuit region and deposited on a surface layer of the semiconductor layer; a breakdown voltage region of the second conductivity-type arranged in contact with the well region to surround the well region and having a lower impurity concentration than the well region; a base region of the first conductivity-type arranged in contact with the breakdown voltage region to surround the breakdown voltage region; a carrier supply region of the second conductivity-type arranged on a surface layer of the base region and serving as a level shifter included in a level-shift circuit that transfers signals between the low-potential-side circuit region and the high-potential-side circuit region; and a carrier reception region of the level shifter arranged on a surface layer of the well region or the breakdown voltage region, wherein the carrier supply region and the carrier reception region are arranged parallel to each other in a planar pattern, the carrier supply region has a wider width than the carrier reception region, and a density of the carrier supply region is lower at a position opposed to the carrier reception region than at a position not opposed to the carrier reception region.

BRIEF DESCRIPTION OF THE DRAWINGS

FIG. 25 is a cross-sectional view illustrating a semiconductor device according to a ninth embodiment of the present invention.

DETAILED DESCRIPTION

Figure 1:
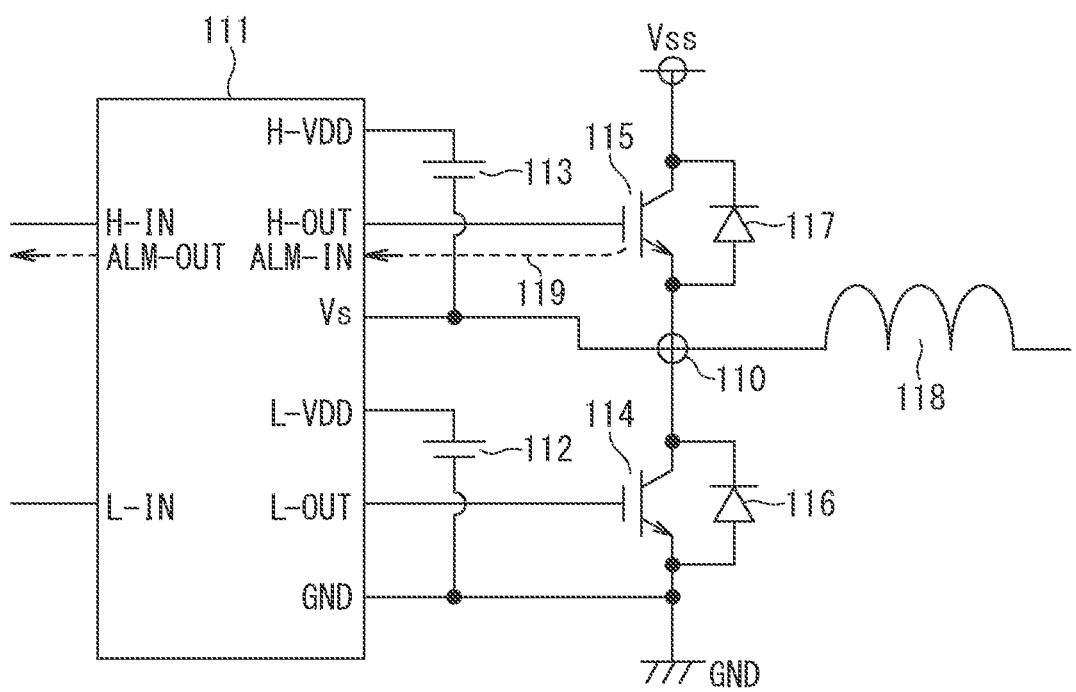
FIG. 1 is a circuit diagram illustrating a connection example of a semiconductor device according to a first embodiment of the present invention.

With reference to the Drawings, first to ninth embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The embodiments described below merely illustrate schematically devices and methods for specifying and giving shapes to the technical idea of the present invention, and the span of the technical idea is not limited to materials, shapes, structures, and relative positions of elements described herein.

In the Specification, a "carrier supply region" means a semiconductor region which supplies majority carriers as a main current. The carrier supply region is assigned to a semiconductor region which will be a source region in a field-effect transistor (FET) or a static induction transistor (SIT), an emitter region in an insulated-gate bipolar transistor (IGBT), and an anode region in a static induction (SI) thyristor or a gate turn-off (GTO) thyristor. A "carrier reception region" means a semiconductor region which receive majority carriers as a main current. The carrier reception region is assigned to a semiconductor region which will be the drain region in the FET or the SIT, the collector region in the IGBT, and the cathode region in the SI thyristor or GTO thyristor. A "control electrode" has a function of controlling the main current flowing between the carrier supply region and the carrier reception region. The control electrode is assigned to a gate electrode of the FET, SIT, IGBT, SI thyristor or GTO thyristor.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

Further, in the following description, there is exemplified a case where a first conductivity-type is an p-type and a second conductivity-type is a n-type. However, the relationship of the conductivity-types may be inverted to set the first conductivity-type to the n-type and the second conductivity-type to the p-type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration. Moreover, the members and the regions that are limited by adding "first conductivity-type" and "second conductivity-type" in the following description indicate the members and the regions formed of semiconductor materials without particular obvious limitations.

First Embodiment

A semiconductor device (a semiconductor integrated circuit) according to a first embodiment of the present invention is illustrated below with a high-voltage integrated circuit (HVIC) of a self-shielding system. FIG. 1 illustrates a connection example between a HVIC 111 that is the semiconductor device according to the first embodiment of the present invention and IGBTs 114 and 115 that are switching power devices (switching elements) of a power conversion device such as an inverter driven by the HVIC 111. The switching elements of the power conversion device are not limited to the IGBTs 114 and 115, and may be other switching elements such as MOSFETs.

The IGBTs 114 and 115 are connected in series to implement a half bridge. The IGBTs 114 and 115 are connected antiparallel to freewheeling diodes (FWD) 116 and 117. An emitter of the IGBT 114 is connected to a ground potential (GND potential). A collector of the IGBT 115 is connected to a Vss potential on a high-potential side of a high-voltage power supply as a main circuit power supply.

The IGBT 115 serving as an upper arm and the IGBT 114 serving as a lower arm in the power conversion device illustrated in FIG. 1 are alternately turned on, so as to alternately output a high potential or a low potential from a Vs terminal 110 as an output terminal to supply AC power (lead an AC current to flow) to an L-load 118. In particular, when the high potential is output, the respective IGBTs 114 and 115 are operated such that the IGBT 115 as the upper arm is turned on and the IGBT 114 as the lower arm is turned off. When the low potential is output, the respective IGBTs 114 and 115 are reversely operated such that the IGBT 115 of the upper arm is turned off and the IGBT 114 of the lower arm is turned on.

The HVIC 111 that drives the IGBTs 114 and 115 outputs a gate signal based on a GND potential to a gate of the IGBT 114 as the lower arm, and outputs a gate signal based on a Vs potential of the Vs terminal 110 to a gate of the IGBT 115 as the upper arm. The HVIC 111 thus needs to have a level shift function.

Reference sign "Vs" in the HVIC 111 illustrated in FIG. 1 refers to a midpoint potential that varies from the Vss potential to the GND potential. Reference sign "H-VDD" in the HVIC 111 refers to a high-potential side of a low-voltage power supply 113 based on the Vs potential. Reference sign "L-VDD" in the HVIC 111 refers to a high-potential side of a low-voltage power supply 112 based on the GND potential. In a case of a bootstrap circuit system, the low-voltage power supply 113 is composed of an external capacitor (not illustrated) with an externally-equipped bootstrap diode (not illustrated) connected between the L-VDD and the H-VDD.

Reference sign "H-IN" in the HVIC 111 refers to an input signal input to a gate of a CMOS circuit on the low side connected to a level-up circuit, and also refers to an input terminal. Reference sign "L-IN" in the HVIC 111 refers to an input signal input to a gate of a CMOS circuit on the low side connected to the gate of the IGBT 114 as the lower arm, and also refers to an input terminal. Reference sign "H-OUT" in the HVIC 111 refers to an output signal of a CMOS circuit on the high side output to the gate of the IGBT 115 as the upper arm, and also refers to an output terminal. Reference sign "L-OUT" in the HVIC 111 refers to an output signal output to the gate of the IGBT 114 as the lower arm, and also refers to an output terminal. Reference sign "ALM-IN" in the HVIC 111 refers to an input signal of a detection signal 119 when a temperature or an overcurrent of the IGBT 115 as the upper arm is detected, and also refers to an input terminal. Reference sign "ALM-OUT" in the HVIC 111 refers to an output signal of a detection signal with a level lowered, and also refers to an output terminal.

Figure 2:
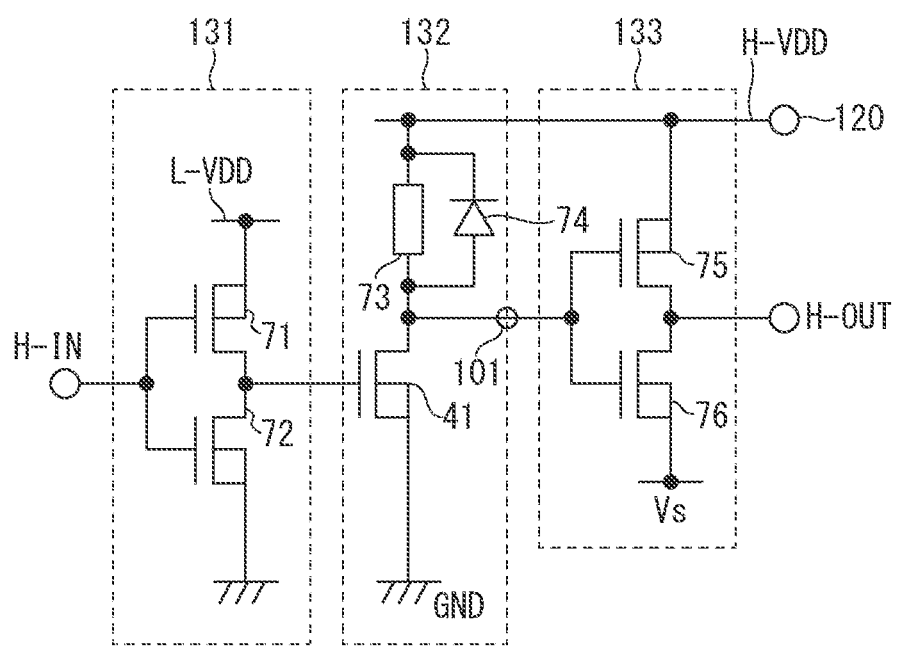
FIG. 2 is a circuit diagram illustrating the semiconductor device according to the first embodiment of the present invention.

FIG. 2 is a circuit diagram illustrating a level-shift circuit (a level-up circuit) 132 and circumferential circuits (131, 133) around the level-up circuit 132 inside the HVIC 111 illustrated in FIG. 1. The circumferential circuits (131, 133) illustrated include a low-side circuit 131 on the low side that transmits an input signal toward the level-up circuit 132, and a high-side circuit 132 on the high side that transmits an output signal from the level-up circuit 132 to the IGBT 115 as the upper arm. The low-side circuit 131 includes a p-channel MOSFET 71 and an n-channel MOSFET 72 implementing a CMOS circuit. The high-side circuit 133 includes a p-channel MOSFET 75 and an re-channel MOSFET 76 implementing a CMOS circuit.

The level-up circuit 132 includes a level-shift resistor 73, and an n-channel MOSFET 41 with a drain connected to the level-shift resistor 73. The connected part between the level-shift resistor 73 and the n-channel MOSFET 41 serves as an output part 101 of the level-up circuit 132. An anode and a cathode of a diode 74 are connected to the both ends of the level-shift resistor 73. The diode 74 clamps a drop of overvoltage on both sides of the level-shift resistor 73. An H-VDD terminal 120 on the high-potential side of the low-voltage power supply 113 based on the Vs potential is connected to one end of the level-shift resistor 73 and a source of the p-channel MOSFET 75 of the high-side circuit 133.

When the input signal H-IN is input to the low-side circuit 131 illustrated in FIG. 2, an ON/OFF signal of a low-side level is input to a gate of the n-channel MOSFET 41 of the level-up circuit 132 via the CMOS circuit (71, 72) of the low-side circuit 131. The input of the ON/OFF signal turns on/off the n-channel MOSFET 41, and an ON/OFF signal of a high-side level is output through the output part 101 of the level-up circuit 132. The output ON/OFF signal turns on/off the CMOS circuit (75, 76) of the high-side circuit 133 so as to output the output signal H-OUT. The output signal H-OUT is converted to a signal based on the Vs potential. The output signal H-OUT is applied to the gate of the IGBT 115 as the upper arm illustrated in FIG. 1 so as to turn on/off the IGBT 115 as the upper arm.

Figure 3:
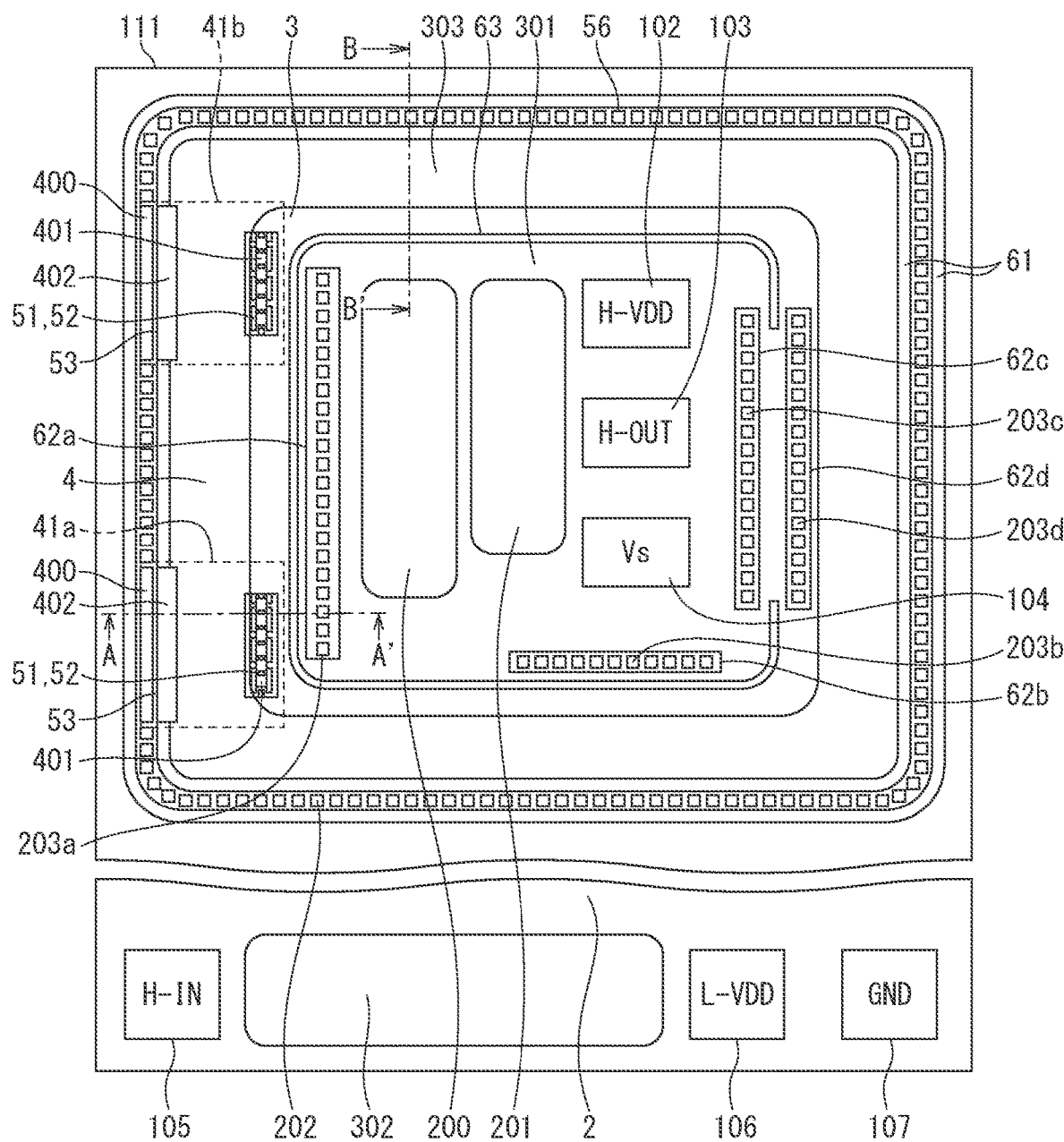
FIG. 3 is a plan view illustrating a main part of the semiconductor device according to the first embodiment of the present invention.
Figure 4:
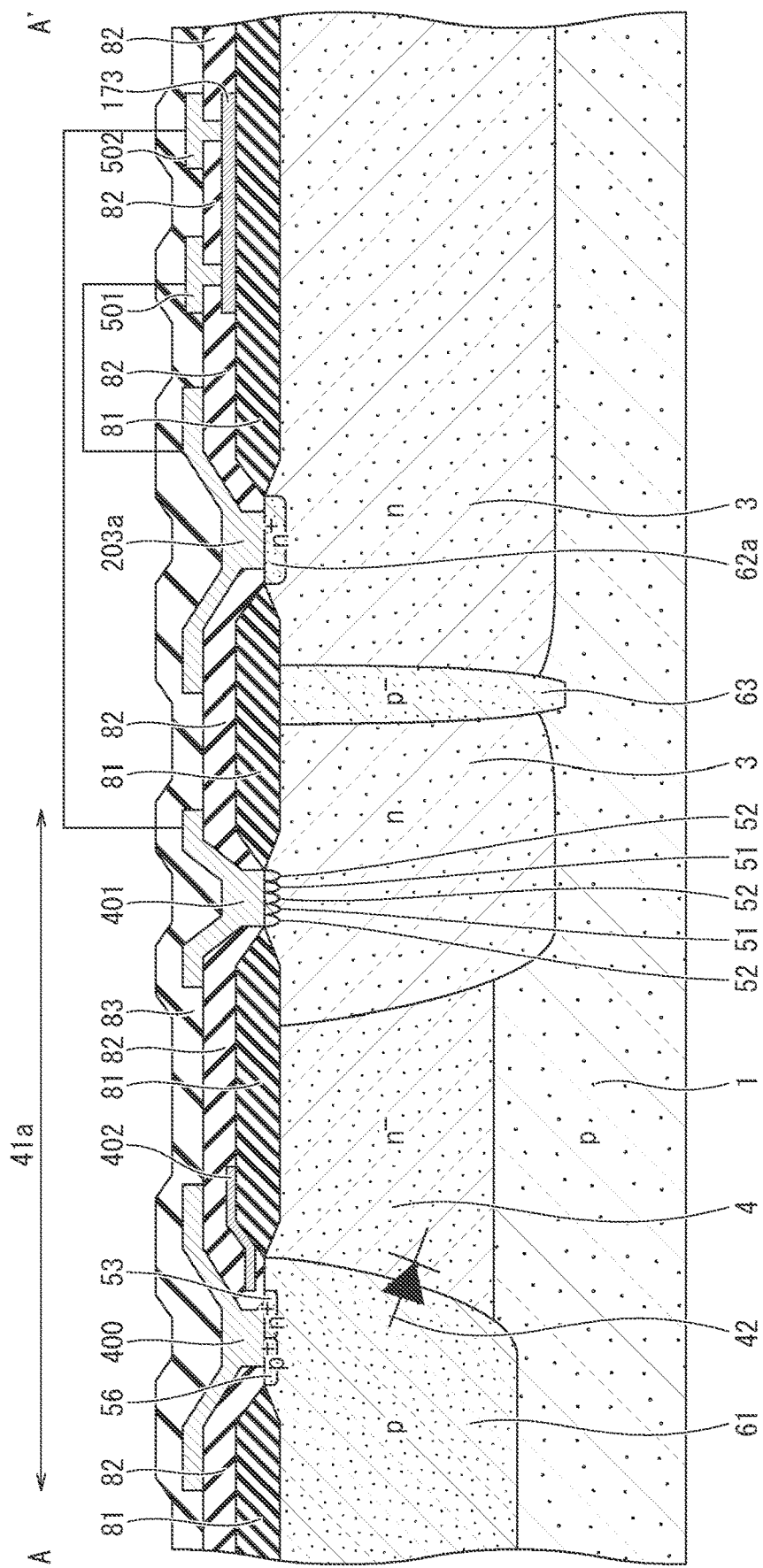
FIG. 4 is a cross-sectional view as viewed from direction A-A' in FIG. 3.

A configuration of the semiconductor device according to the first embodiment of the present invention is described below. FIG. 3 is a plan view illustrating a main part of the semiconductor device according to the first embodiment of the present invention. FIG. 4 is a cross-sectional view including a high-voltage n-channel MOSFET 41a as viewed from direction A-A' in FIG. 3, and FIG. 5 is a cross-sectional view as viewed from direction B-B' in FIG. 3.

As illustrated in FIG. 3, the HVIC 111 that is the semiconductor device according to the first embodiment of the present invention includes, in a single chip, a high-potential-side circuit region (a high-side circuit region) 301, a high-voltage junction termination (HVJT) structure 303 arranged into a looped shape along the circumference of the high-side circuit region 301, and a low-potential-side circuit region (a low-side circuit region) 302 arranged at the circumference of the high-side circuit region 301 via the HVJT 303. The high-side circuit region 301 includes the high-side circuit 133 illustrated in FIG. 2 as an internal circuit. The low-side circuit region 302 includes the low-side circuit 131 illustrated in FIG. 2 as an internal circuit. The HVJT 303 electrically isolates the high-side circuit region 301 and the low-side circuit region 302.

Figure 5:
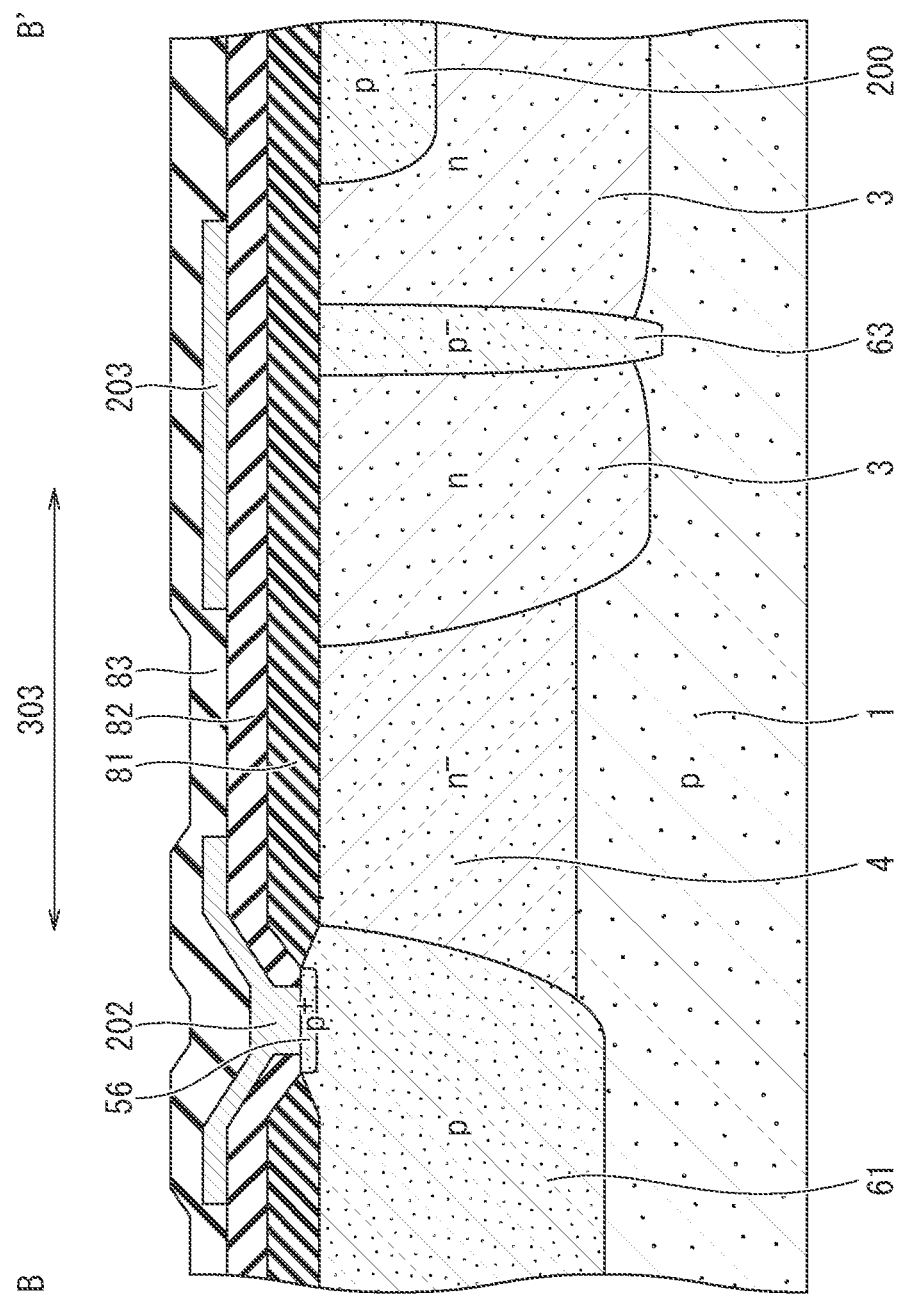
FIG. 5 is a cross-sectional view as viewed from direction B-B' in FIG. 3.

As illustrated in FIG. 3 to FIG. 5, the HVIC 111 includes an n-type well region 3 that is a high-side floating potential region provided inside a p-type semiconductor layer 1 on one of the main surfaces (referred to below as a "surface layer"). The p-type semiconductor layer 1 as used herein can be a silicon (Si) substrate, for example, or may be a compound semiconductor substrate such as silicon carbide (SiC), gallium nitride (GaN), and gallium arsenide (GaAs), or a semimetal substrate. The semiconductor layer 1 may also be an epitaxially-grown layer of p-type or n-type deposited on a p-type semiconductor substrate. The semiconductor layer 1 in this case may be formed such that an n-type buried layer is partly buried between the p-type semiconductor substrate and the epitaxially-grown layer. The n-type well region 3 may be provided at a depth so as to be in contact with the n-type buried layer.

The n-type well region 3 is located in the high-side circuit region 301. The n-type well region 3 is provided with a Vs potential region 200 and an H-VDD potential region 201. The Vs potential region 200 includes as a high-side logic part an n$^+$-type source region, a p-type base region, and an n-type drain region of an n-channel MOSFET, and a p-type drain region of a p-channel MOSFET. The H-VDD potential region 201 includes a p$^+$-type source region and an n-type base region of a p-channel MOSFET as a high-side logic part. An H-VDD pad 102, an H-OUT pad 103, and a Vs pad 104 are provided on the n-type well region 3.

As illustrated in FIG. 3, the n-type well region 3 is further provided with a p-type junction-isolation region (a slit region) 63 into a looped shape (a C-shape) to surround the circumference of the Vs potential region 200 and the H-VDD potential region 201. As illustrated in FIG. 4 and FIG. 5, the p-type junction-isolation region 63 has a depth to penetrate the n-type well region 3 and reach the p-type semiconductor layer 1 so as to divide the n-type well region 3 by junction isolation. FIG. 5 is a cross-sectional view illustrating a pickup electrode 203 provided over the p-type junction-isolation region 63 via insulating films 81 and 82.

As illustrated in FIG. 3, n$^+$-type pickup regions 62a, 62b, and 62c are arranged into a belt shape or a looped shape on the surface layer of the n-type well region 3 inside the p-type junction-isolation region 63. The n$^+$-type pickup regions 62a, 62b, and 62c are respectively provided on the upper side with pickup electrodes (pickup contacts) 203a, 203b, and 203c connected to the H-VDD terminal.

The surface layer of the n-type well region 3 is also provided with an n$^+$-type pickup region 62d on the outside of the p-type junction-isolation region 63 at a position corresponding to an opening (a gap) of the p-type junction-isolation region 63 in the planar pattern. The n$^+$-type pickup region 62d is located at a position opposed to the n$^+$-type pickup region 62c. The n$^+$-type pickup region 62d is provided on the upper side with a pickup electrode (a pickup contact) 203d connected to the H-VDD terminal.

As illustrated in FIG. 3 to FIG. 5, an n$^-$-type breakdown voltage region 4 having a lower impurity concentration than the n-type well region 3 is arranged into a looped shape in contact with the n-type well region 3 to surround the n-type well region 3. A p-type base region 61 is further arranged into a looped shape in contact with the n$^-$-type breakdown voltage region 4 to surround the n$^-$-type breakdown voltage region 4. The insulating films 81, 82, and 83 are deposited on the n-type well region 3, the n$^-$-type breakdown voltage region 4, and the p-type base region 61. As schematically illustrated in FIG. 4, a p-n junction between the n$^-$-type breakdown voltage region 4 and the p-type base region 61 forms a parasitic diode 42 so as to compose the HVJT 303.

The p-type base region 61 has a higher impurity concentration than the p-type semiconductor layer 1. The p-type base region 61 sets the p-type semiconductor layer 1 to the GND potential. The surface layer of the p-type base region 61 is provided with a p$^+$-type contact region 56 having a higher impurity concentration than the p-type base region 61 and arranged into a looped shape along the surface of the p-type semiconductor layer 1. As illustrated in FIG. 3 and FIG. 5, a pickup electrode (a pickup contact) 202 connected to the GND potential is arranged into a looped shape on the p$^+$-type contact region 56.

As illustrated on the lower side of FIG. 3, the low-side circuit region 302 is provided in the p-type well region 2 surrounding the p-type base region 61. The p-type well region 2 is further provided with an H-IN pad 105, an L-VDD pad 106, and a GND pad 107.

As illustrated in FIG. 3, the high-voltage n-channel MOSFETs 41a and 41b are each provided partly in the HVJT 303 to serve as a level shifter for transmitting signals between the high-side circuit region 301 and the low-side circuit region 302. The high-voltage n-channel MOSFETs 41a and 41b correspond to the n-channel MOSFET 41 illustrated in FIG. 2. The two high-voltage n-channel MOSFETs 41a and 41b are provided to be used for a SET signal and a RESET signal, since the signal transmission to the high-side logic and the output circuit is executed by a two-input method using the SET signal and the RESET signal. The respective high-voltage n-channel MOSFETs 41a and 41b have the same structure, and the following explanations are made while mainly focusing on the high-voltage n-channel MOSFET 41a.

As illustrated in FIG. 3 and FIG. 4, the high-voltage n-channel MOSFET 41a uses the n$^-$-type breakdown voltage region 4 as a drift region. The high-voltage n-channel MOSFET 41a includes an n$^+$-type source region 53 arranged adjacent to the p$^+$-type contact region 56 on the surface layer of the p-type base region 61. A source electrode 400 is deposited on and in contact with the p$^+$-type contact region 56 and the n$^+$-type source region 53.

The high-voltage n-channel MOSFET 41a includes a universal contact region (51, 52) serving as a drain region provided on the surface layer of the n-type well region 3. The term "universal contact region" as used herein refers to a region in which at least one p$^+$-type contact region (p$^+$-type region) and at least one n$^+$-type contact region (n$^+$-type region) are arranged in contact with each other. FIG. 3 and FIG. 4 illustrate the universal contact region (51, 52) having a structure in which p$^+$-type contact regions 51 and an n$^+$-type contact region 52 are alternately arranged in contact with each other along the surface of the p-type semiconductor layer 1. The p$^+$-type contact regions 51 and the n$^+$-type contact region 52 may be formed at the same depth, or either the p$^+$-type contact regions 51 or the n$^+$-type contact region 52 may have a greater depth than the other one.

While FIG. 3 and FIG. 4 illustrate the structure in which the universal contact region (51, 52) is provided on the surface of the n-type well region 3, the universal contact region (51, 52) may be provided on the surface layer of the n⁻-type breakdown voltage region 4 instead.

A universal electrode (a universal contact) 401 is deposited on and in ohmic contact with the universal contact region (51, 52). The universal contact region (51, 52) and the universal electrode 401 form a universal contact structure (51, 52, 401).

As illustrated in FIG. 4, a gate electrode 402 is provided between the source electrode 400 and the drain electrode 401 on the p-type base region 61 via a gate insulating film. The gate electrode 402 is formed of polysilicon, for example. The pickup electrode 202 and the source electrode 400 are connected to the GND potential to have the same potential.

Figure 6:
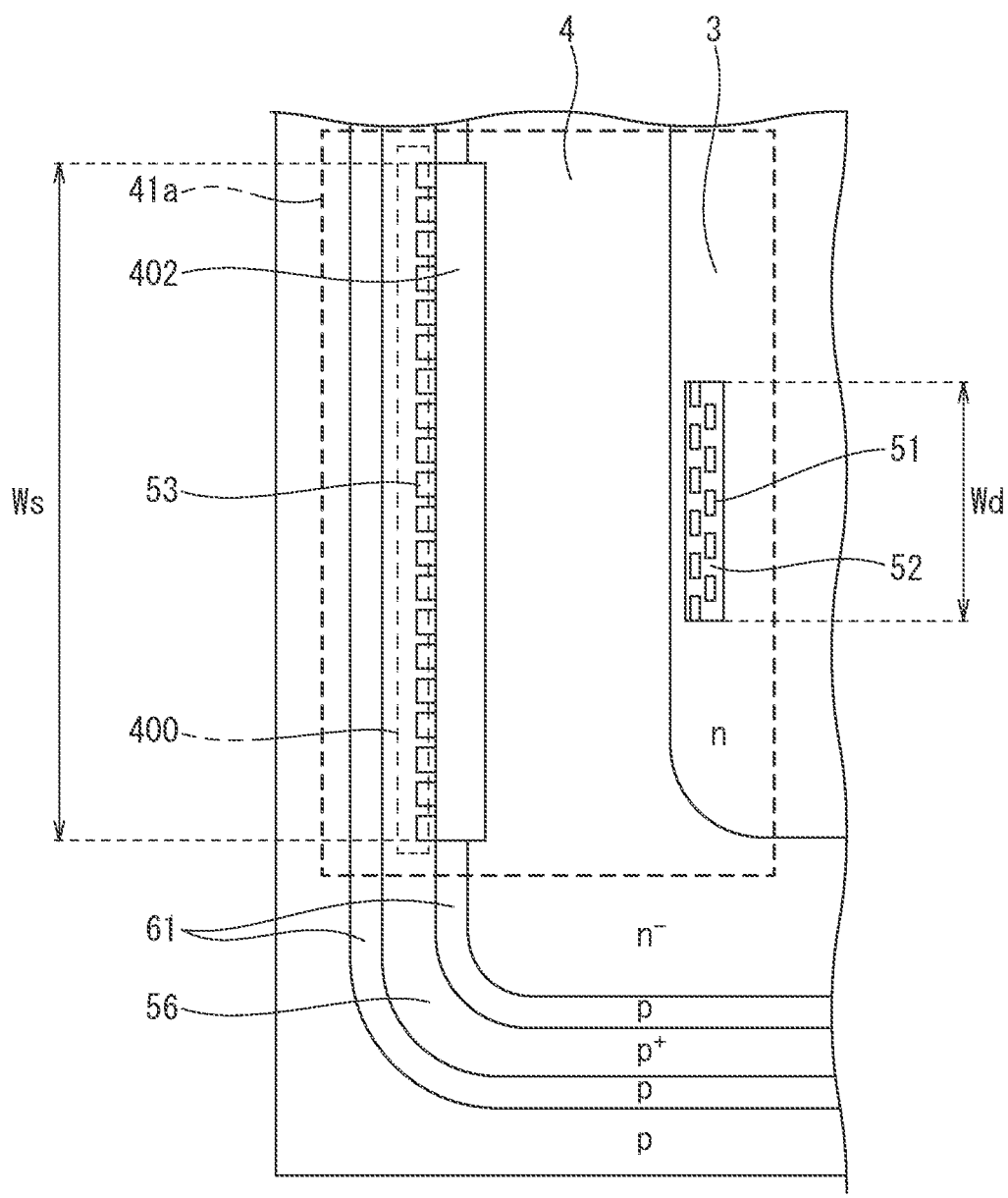
FIG. 6 is a plan view illustrating a circumferential part of a level shifter according to the first embodiment of the present invention.

FIG. 6 is a partly-enlarged view illustrating a circumferential part of the high-voltage n-channel MOSFET 41a illustrated in FIG. 1. FIG. 6 indicates a contact part of the source electrode 400 by the broken line. As illustrated in FIG. 6, the n⁺-type source region 53 and the universal contact region (51, 52) are arranged in parallel to each other. The n⁺-type source region 53 and the universal contact region (51, 52) each have a straight planar pattern. A width Ws of the n⁺-type source region 53 of the high-voltage re-channel MOSFET 41a in the upper-lower direction in FIG. 6 is greater than a width Wd of the universal contact region (51, 52) that is the drain region of the high-voltage re-channel MOSFET 41a. An effective channel width defined by the width of the p-type base region 61 at a part overlapping with the gate electrode 402 is also substantially the same as the width Ws of the n⁺-type source region 53 and is greater than the width Wd of the universal contact region (51, 52).

The width Ws of the n⁺-type source region 53 is defined between the both ends of the n⁺-type source region 53, and the p⁺-type contact region 56 may be interposed between the gaps of the n⁺-type source region 53, as illustrated in FIG. 6. While FIG. 6 illustrates the p⁺-type contact region 56 interposed between the gaps of the n⁺-type source region 53, the n⁺-type source region 53 is not necessarily arranged to interpose the p⁺-type contact region 56, and may have a planar pattern extending straight.

Figure 7:
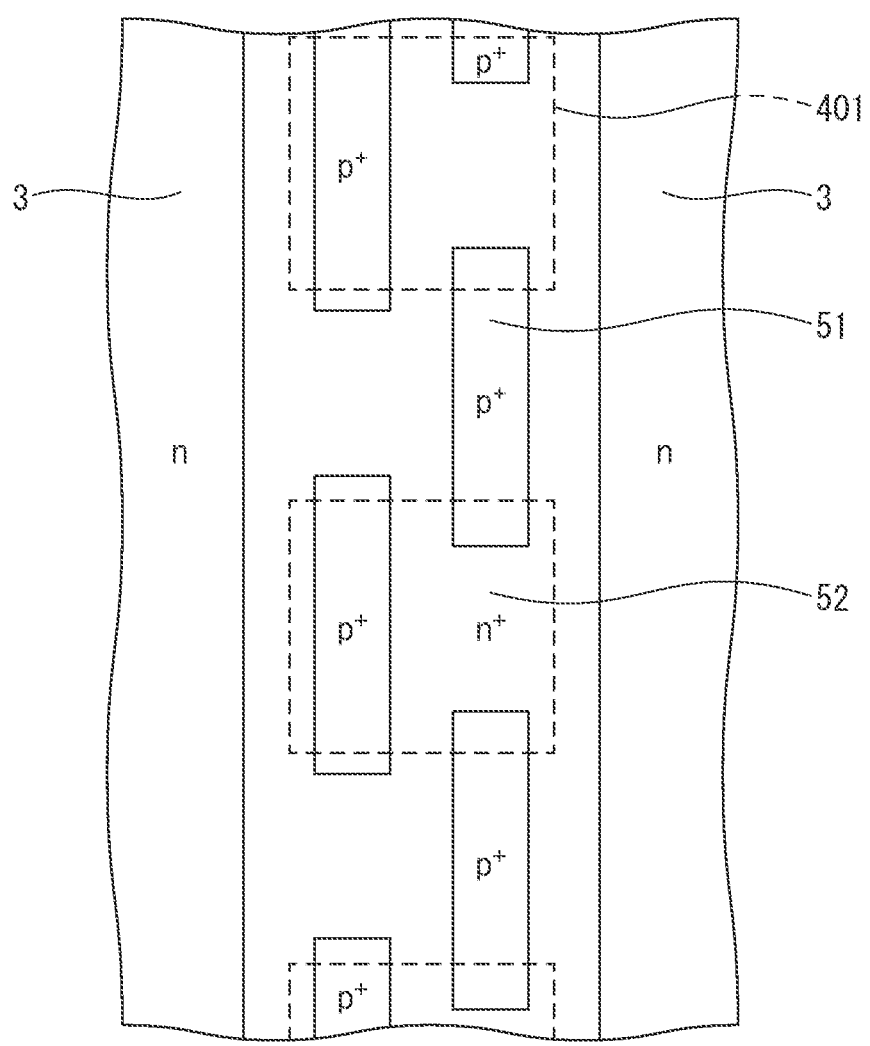
FIG. 7 is a plan view illustrating a universal contact region according to the first embodiment of the present invention.

FIG. 7 illustrates a planar pattern of the universal contact region (51, 52). The p⁺-type contact regions 51 each have a rectangular planar shape, and are arranged in an islanded state. The n⁺-type contact region 52 is provided to surround the circumferences of the p⁺-type contact regions 51. FIG. 7 indicates the planar pattern of the contact part of the universal electrode 401 by the broken line. The contact part of the universal electrode 401 is illustrated with the rectangular planar pattern in FIG. 7, but may have a line shape extending straight in the longitudinal direction of the universal contact region (51, 52).

The p⁺-type contact regions 51 and the n⁺-type contact region 52 are each formed independently of each other by use of a different mask for ion implantation. For example, the p⁺-type contact regions 51 may be formed first, and the n⁺-type contact region 52 may be then selectively formed at a position deeper than the surface of the p⁺-type contact regions 51.

Figure 8:
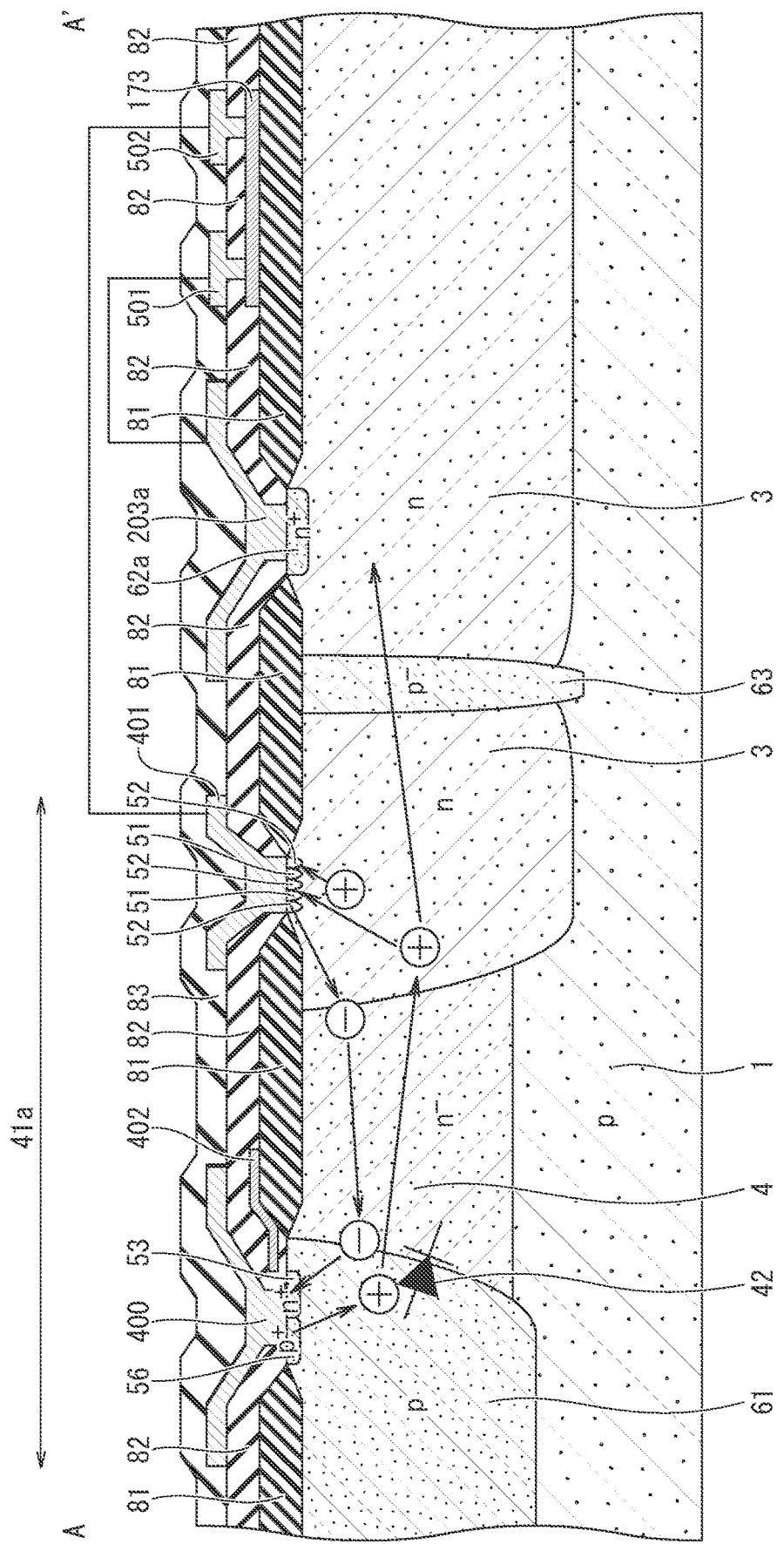
FIG. 8 is a cross-sectional view illustrating a behavior of electrons and holes when a negative surge voltage is applied in the semiconductor device according to the first embodiment of the present invention.

The use of the universal contact region (51, 52) as the drain region of the high-voltage n-channel MOSFET 41a can extract holes that are minority carriers flowing through the parasitic body diode 42 immediately from the universal electrode 401, as illustrated in FIG. 8, when the negative surge voltage is applied to the H-VDD terminal through the Vs terminal 110. The extraction of the holes can reduce inversion recovery current Irr (hole current) when the Vs potential is recovered and the body diode 42 is led to be in an inversion recovery state, so as to regulate an operation of a parasitic npn bipolar transistor including the n⁺-type source region 53, the p-type base region 61, and the n⁻-type breakdown voltage region 4, avoiding an error operation of the level-shift circuit or damage by thermal runaway caused by a parasitic operation accordingly.

To enhance the effect of extracting the hole carriers in the n⁻-type breakdown voltage region 4 and the n-type well region 3 by the body diode 42 in the high-voltage n-channel MOSFET 41a during the period in which the negative surge voltage is applied to the Vs terminal 110, a ratio of the p⁺-type contact regions 51 is preferably increased with respect to the n⁺-type contact region 52 in the universal contact region (51, 52).

The increase in the ratio of the p⁺-type contact regions 51, however, not only increases a drain contact resistance in the high-voltage n-channel MOSFET 41a to lead to a decrease in ON current, but also leads the body diode 42 to be in a reverse biased state to causes an avalanche breakdown when a positive surge such as electrostatic discharge (ESD) is input from the H-VDD terminal to the n⁺-type contact region 52. The electrons generated by the avalanche breakdown then flow through the n-type well region 3 as majority carriers. These electrons are introduced into the n⁺-type contact region 52 of the universal contact region (51, 52). When the p⁺-type contact regions 51 are arranged into double or triple wide lines to surround the n⁺-type contact region 52, a resistance (a base resistance) in the n-type well region 3 immediately under the p⁺-type contact regions 51 increases. If a voltage drop of 0.6 volts is caused in the n-type well region 3 immediately under the p⁺-type contact regions 51, the parasitic pnp bipolar transistor including the p-type semiconductor layer 1, the n-type well region 3, and the p⁺-type contact regions 51 starts operating, which may lead to current damage accordingly.

To avoid the operation of the parasitic pnp bipolar transistor described above, the p⁺-type contact regions 51 are preferably arranged not into a straight line but into shortly-divided islands doubled or more so as to overlap with each other within the n⁺-type contact region 52 surrounding the outer circumference of the p⁺-type contact regions 51, as illustrated in FIG. 7 (FIG. 7 illustrates a doubled structure). The contact of the universal electrode 401 is then formed to extend across the n⁺-type contact region 52 and the p⁺-type contact regions 51. This configuration can absorb the electrons also in the n⁺-type contact region 52 interposed between the respective p⁺-type contact regions 51, so as to avoid an increase in local base resistance and regulate the operation of the parasitic pnp bipolar transistor.

The p⁺-type contact regions 51 arranged in the islanded state may have a circular planar pattern or may have a polygonal planar pattern such as a rectangular shape as the planar pattern of the universal contact region (51, 52). Alternatively, the n⁺-type contact region 52 and the p⁺-type contact regions 51 may be formed into lines (for example, in stripes) to be in contact with each other. The arrangement of the n⁺-type contact region 52 on the outer circumferential side can avoid a great decrease in ON current of the high-voltage n-channel MOSFET 41a, so as to regulate the operation of the parasitic pnp bipolar transistor without impeding the stability of the level shift operation.

Although not illustrated in FIG. 3, a resistor (a level-shift resistor) 173 is deposited on the n-type well region 3 via the insulating film 81, as illustrated in FIG. 4. The level-shift resistor 173 corresponds to the level-shift resistor 73 illustrated in the equivalent circuit diagram of FIG. 2. The level-shift resistor 173 can be formed of polysilicon, for example. The level-shift resistor 173 may be formed either as the same layer as or as a layer different from the gate electrode 402 of the high-voltage n-channel MOSFET 41*a*.

A first electrode 501 and a second electrode 502 are arranged on the top surface of the level-shift resistor 173. The first electrode 501 and the second electrode 502 are electrically connected to the respective ends of the level-shift resistor 173. While FIG. 4 indicates the electrical connection between the pickup electrode 203*a* and the first electrode 501 by the solid line for illustration purposes, the pickup electrode 203*a* and the first electrode 501 may be formed either as the same wiring layer or as different wiring layers so as to be connected to each other through a via hole. While FIG. 4 indicates the electrical connection between the universal electrode 401 and the second electrode 502 by the solid line for illustration purposes, the universal electrode 401 and the second electrode 502 may be formed either as the same wiring layer or as different wiring layers so as to be connected to each other through a via hole. The pickup electrode 203*a* is electrically connected via the level-shift resistor 173 to the universal contact region (51, 52) that is the drain region of the high-voltage n-channel MOSFET 41*a*.

In a process of manufacturing the semiconductor device according to the first embodiment of the present invention, the n⁻-type breakdown voltage region 4, the n-type well region 3, the p-type base region 61, and the p-type junction-isolation region 63 are formed such that n-type impurity ions such as phosphorus or p-type impurity ions such as boron are implanted through a delineating step, and are then diffused to a predetermined diffusion depth at a high temperature (such as about 1100° C. to 1200° C.) in a diffusion step. The Vs potential region 200 provided in the high-side circuit part and the well region in the low-side circuit part, for example, are formed such that impurity ions are diffused into a predetermined diffusion depth in a diffusion step independent of the diffusion step for forming the n⁻-type breakdown voltage region 4, the n-type well region 3, the p-type base region 61, and the p-type junction-isolation region 63 at a high temperature (such as about 1100° C. to 1200° C.).

The respective n⁺-type pickup regions 62 are formed such that n-type impurity ions such as arsenic are implanted to a predetermined diffusion depth so as to have a surface concentration of about $1\times10^{20}/cm^3$, and are then subjected to annealing at a temperature of about 750° C. to 900° C. The n⁺-type source regions 53 and the n⁺-type contact region 52 in the high-voltage n-channel MOSFET 41*a* are also formed by the ion implantation and the annealing as in the case of the n⁺-type pickup regions 62. The p⁺-type contact region 56 and the p⁺-type contact regions 51 are formed such that impurity ions such as $BF_2$ are implanted to the respective predetermined diffusion depths so as to have a surface concentration of about $1\times10^{20}/cm^3$ through a delineating step for p⁺-region forming, and are then subjected to annealing at the same temperature of about 750° C. to 900° C. as described above.

Comparative Example

Figure 9:
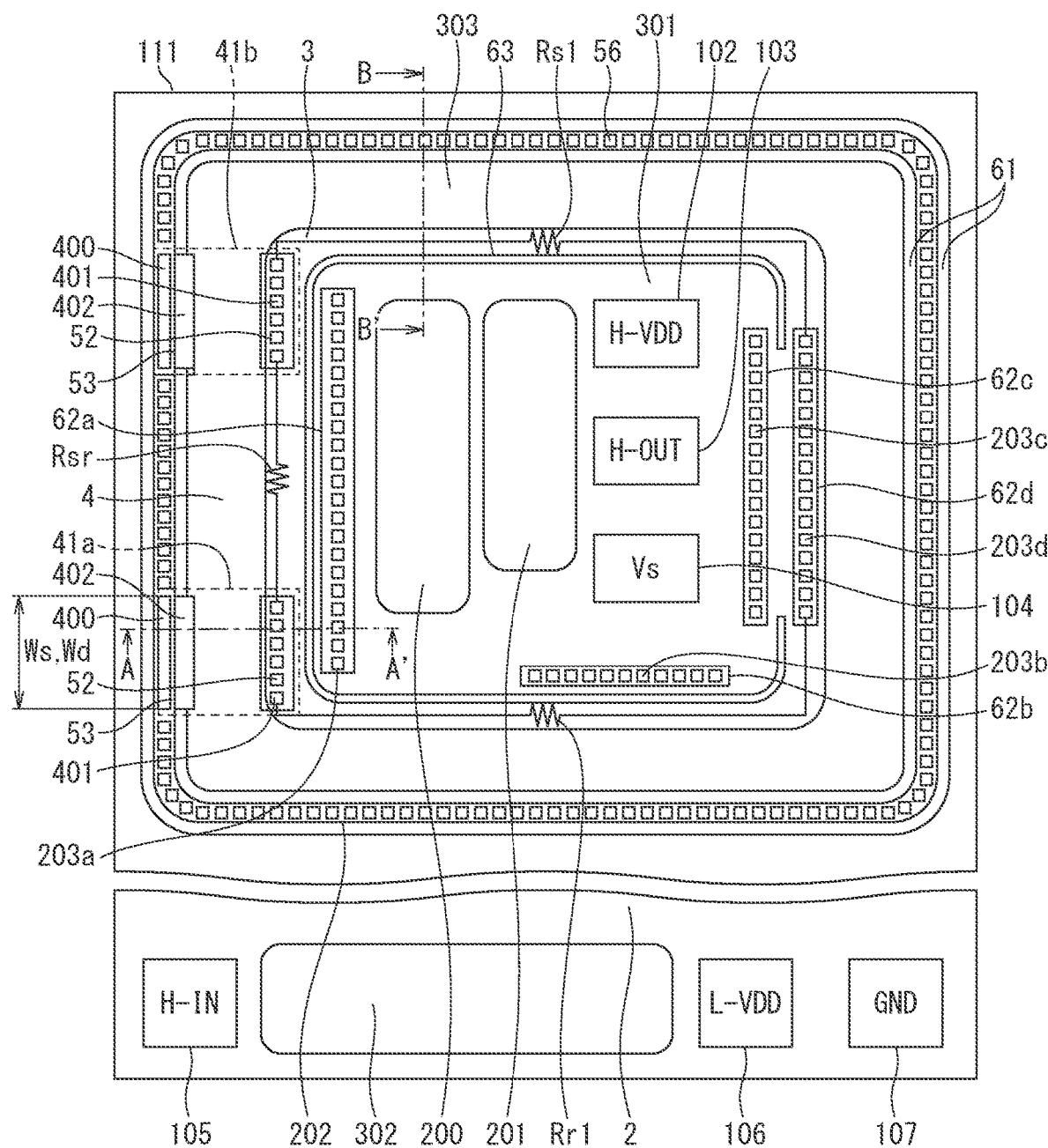
FIG. 9 is a plan view illustrating a semiconductor device of a comparative example.
Figure 10:
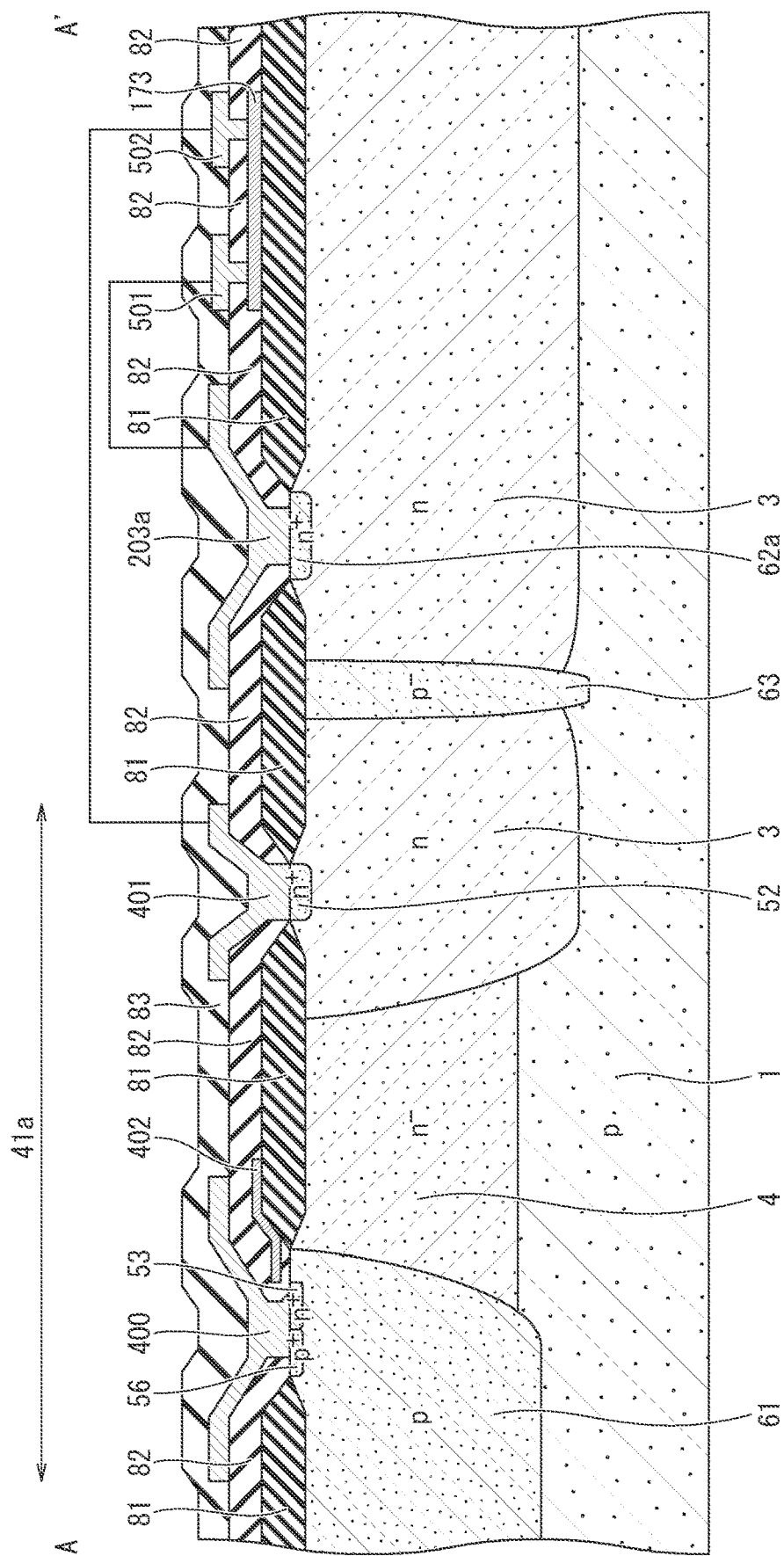
FIG. 10 is a cross-sectional view as viewed from direction A-A' in FIG. 9.

A conventional HVIC of a self-shielding system is described blow as a comparative example. FIG. 9 is a planar layout of the HVIC of the comparative example, and FIG. 10 is a cross-sectional view including the high-voltage n-channel MOSFET 41*a* as viewed from direction A-A' in FIG. 9. FIG. 9 illustrates parasitic resistors Rs1, Rr1, and Rsr present in the HVIC of the self-shielding system. The parasitic resistors Rs1, Rr1, and Rsr are also present in the semiconductor device according to the first embodiment as illustrated in FIG. 3.

The HVIC of the comparative example illustrated in FIG. 9 and FIG. 10 differs from the semiconductor device according to the first embodiment illustrated in FIG. 3 in that the n⁺-type drain region 52 of the high-voltage n-channel MOSFET 41*a* does not compose the universal contact region. The HVIC of the comparative example also differs from the semiconductor device according to the first embodiment illustrated in FIG. 3 in that the width Ws of the n⁺-type source region 53 is the same as the width Wd of the n⁺-type drain region 52. The high-voltage n-channel MOSFET 41*b* has the same structure as the high-voltage n-channel MOSFET 41*a*.

When the IGBT 115 as the upper arm illustrated in FIG. 1 is driven by use of the HVIC of the comparative example, the potential of the Vs terminal or the potential of the H-VDD terminal as a reference potential on the high-potential side of the high-side circuit part included in the HVIC is shifted to the negative potential with respect to the GND potential upon the switching when the IGBT 115 as the upper arm is turned off or when the IGBT 114 as the lower arm is turned on. The shift to the negative potential (the negative surge voltage) may cause an error operation or a latch-up in the high-side circuit part, and lead to damage to the HVIC accordingly.

When the negative surge voltage VSO is lower than the GND potential (0 V)—(Vspy+Vfd), a current starts flowing through the parasitic p-n diode in the HVIC. The sign Vspy as used herein refers to a battery voltage between both ends of the low-voltage power supply 113 on the high side or a bootstrap capacitor (not illustrated), and the sign Vfd refers to a voltage drop in the forward direction of the parasitic p-n diode. An overcurrent flows through the HVIC when the negative surge voltage VSO is greatly led in the minus direction, and as a result, an error operation of the high-side circuit part or a parasitic operation of the respective high-voltage n-channel MOSFETs 41*a* and 41*b* serving as a level shifter is caused, which may lead to damage to the HVIC accordingly.

The negative surge voltage VSO applied is proportional to the product [L1×(dI1/dt)] of a parasitic inductance component L1 derived from a wiring layer on the printed substrate or a cable extending to the L-load 118 and a value of dI1/dt during a period in which an ON current I1 flowing through the IGBT 115 is turned off, and the negative surge voltage VSO in a spike state is applied to the Vs terminal. The applied voltage, which varies depending on the inductance described above, the ON current of the IGBT, or the transient VF characteristics of the FWD, for example, is set to about −50 volts, and the applied term is about 100 to 500 ns.

The semiconductor device according to the first embodiment of the present invention includes the universal contact region (51, 52) that is the drain region of the respective high-voltage n-channel MOSFETs 41*a* and 41*b*, so as to efficiently extract the hole carriers in the p⁺-type contact regions 51 of the universal contact region (51, 52) by the body diode current that flows when the negative surge voltage is input to the Vs terminal 110 and thus reduce remaining carriers. The semiconductor device according to the first embodiment of the present invention can reduce the inversion recovery current Irr (the hole current) when the Vs potential is recovered, and avoid the operation of the parasitic npn bipolar transistor using the inversion recovery current Irr as a trigger. The HVIC 111 of the self-shielding system thus can be achieved that has the improved noise resistance with respect to the negative surge voltage of the Vs terminal and ensures the strength and high reliability without causing an error operation or damage.

In the HVIC 111 of the self-shielding system, the n$^+$-type source region 53 of the respective high-voltage n-channel MOSFETs 41a and 41b serving as a level shifter has the width Ws greater than the width Wd of the universal contact region (51, 52) that is the drain region of the respective high-voltage n-channel MOSFETs 41a and 41b, so as to lower a carrier density of the minority carriers (the holes) under the n$^+$-type source region 53 that tend to return from the drain side upon the inversion recovery of the body diode 42, avoid a voltage drop in the p-type base region 61 under the n$^+$-type source region 53, and suppress the operation of the parasitic npn bipolar transistor.

The area required for keeping the universal contact region (51, 52) as the drain region of the respective high-voltage n-channel MOSFETs 41a and 41b is the same as the area of the n$^+$-type drain region 52 in the HVIC of the comparative example illustrated in FIG. 9 and FIG. 10. This does not lead to an increase in chip size or a change in the number of steps, saving the manufacturing costs accordingly.

While the semiconductor device according to the first embodiment of the present invention sets the width Ws of the n$^+$-type source region 53 of the respective high-voltage n-channel MOSFETs 41a and 41b serving as a level shifter to be greater than the width Wd of the universal contact region (51, 52) as the drain region of the respective high-voltage n-channel MOSFETs 41a and 41b, the width Ws of the n$^+$-type source region 53 may be set to be substantially the same as the width Wd of the universal contact region (51, 52), as in the case of the HVIC of the comparative example illustrated in FIG. 9 and FIG. 10. The semiconductor device in such a case only needs to use the universal contact region (51, 52) as the drain region of the respective high-voltage n-channel MOSFETs 41a and 41b.

Second Embodiment

Figure 11:
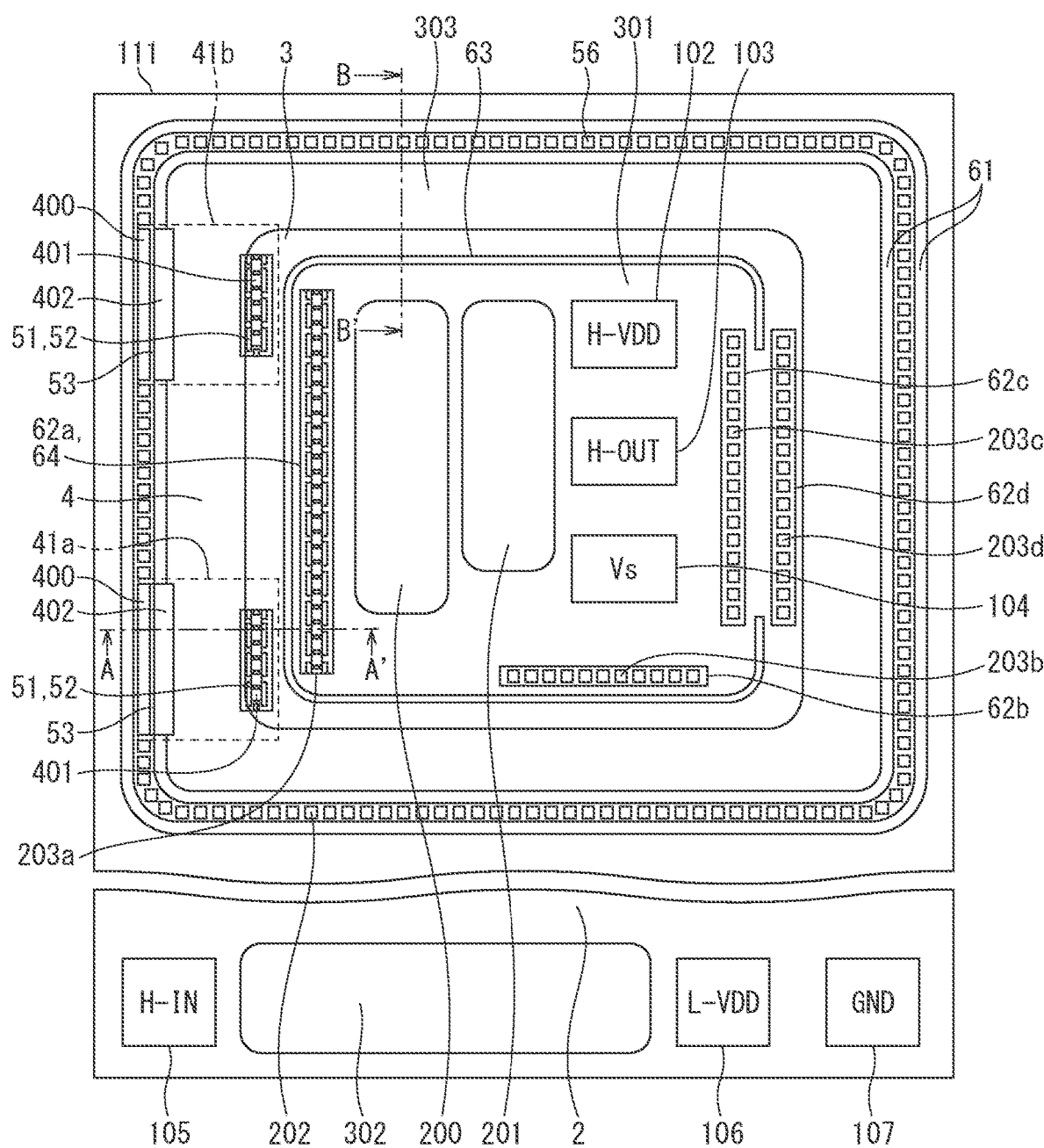
FIG. 11 is a plan view illustrating a main part of a semiconductor device according to a second embodiment of the present invention.
Figure 12:
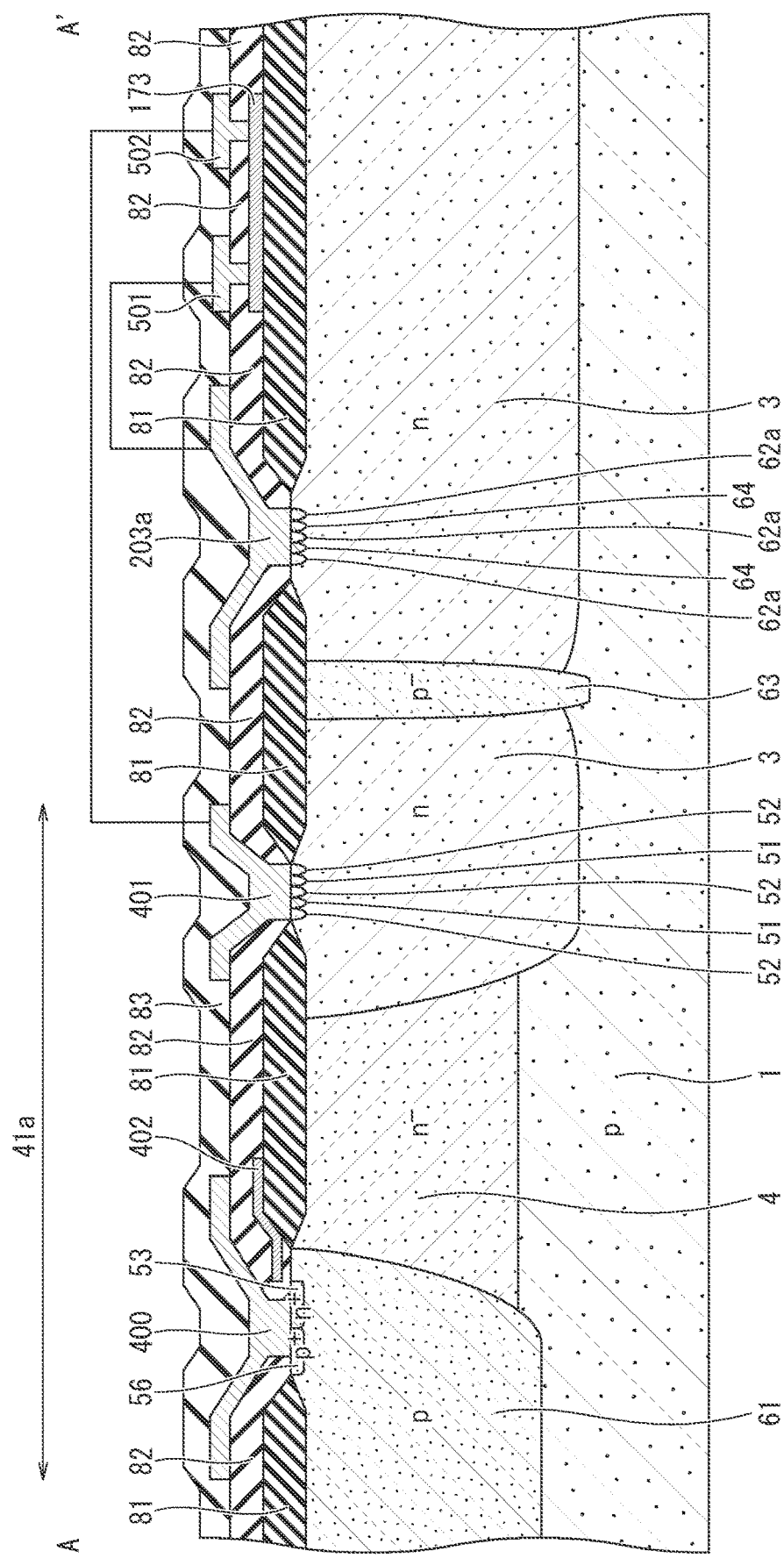
FIG. 12 is a cross-sectional view as viewed from direction A-A' in FIG. 11.

FIG. 11 is a plan view illustrating a main part of a semiconductor device (HVIC) according to a second embodiment of the present invention, and FIG. 12 is a cross-sectional view including the high-voltage n-channel MOSFET 41a as viewed from direction A-A' in FIG. 11. The HVIC according to the second embodiment of the present invention illustrated in FIG. 11 and FIG. 12 differs from the semiconductor device according to the first embodiment of the present invention illustrated in FIG. 3 in that a contact of a pickup region (62a, 64), among pickup regions (62a, 64), 62b, 62c, and 62d of the H-VDD potential, adjacent to the drain region of the respective high-voltage re-channel MOS-FETs 41a and 41b is a universal contact region.

As illustrated in FIG. 11 and FIG. 12, the pickup region (62a, 64) includes an n$^+$-type pickup region 62a and p$^+$-type contact regions 64 alternately arranged in contact with each other along the surface of the p-type semiconductor layer 1 so as to compose the universal contact region. The pickup region (62a, 64) and the pickup electrode 203a form a universal contact structure (62a, 64, 203a).

The pickup region (62a, 64) has the same planar pattern as the universal contact region (51, 52) illustrated in FIG. 7. For example, the p$^+$-type contact regions 64 each have a rectangular planar shape, and are arranged in an islanded state. The n$^+$-type pickup region 62a is provided to surround the circumferences of the p$^+$-type contact regions 64. The other configurations of the semiconductor device according to the second embodiment of the present invention are the same as those of the semiconductor device according to the first embodiment of the present invention, and overlapping explanations are not repeated below.

The semiconductor device according to the second embodiment of the present invention is provided with the pickup region (62a, 64) of the H-VDD potential as the universal contact region adjacent to the drain region of the respective high-voltage re-channel MOSFETs 41a and 41b, so as to reduce the number of the hole carriers penetrating through the p-type junction-isolation region 63 and flowing into the body diode 42. The semiconductor device according to the second embodiment of the present invention thus can avoid the operation of the parasitic npn bipolar transistor caused by an inversion recovery phenomenon of the body diode 42 upon the recovery of the Vs potential from the negative surge.

Third Embodiment

Figure 13:
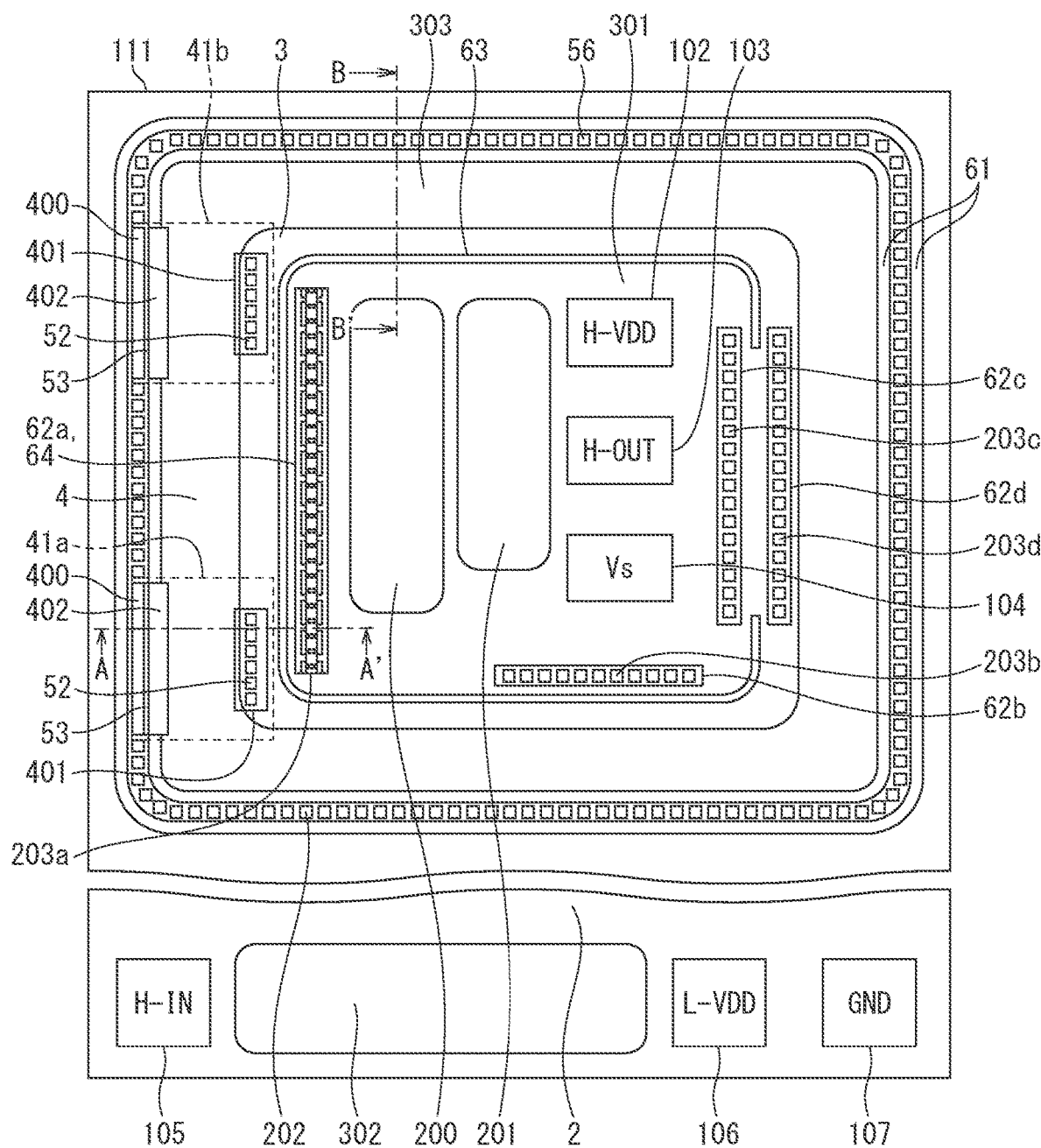
FIG. 13 is a plan view illustrating a main part of a semiconductor device according to a third embodiment of the present invention.
Figure 14:
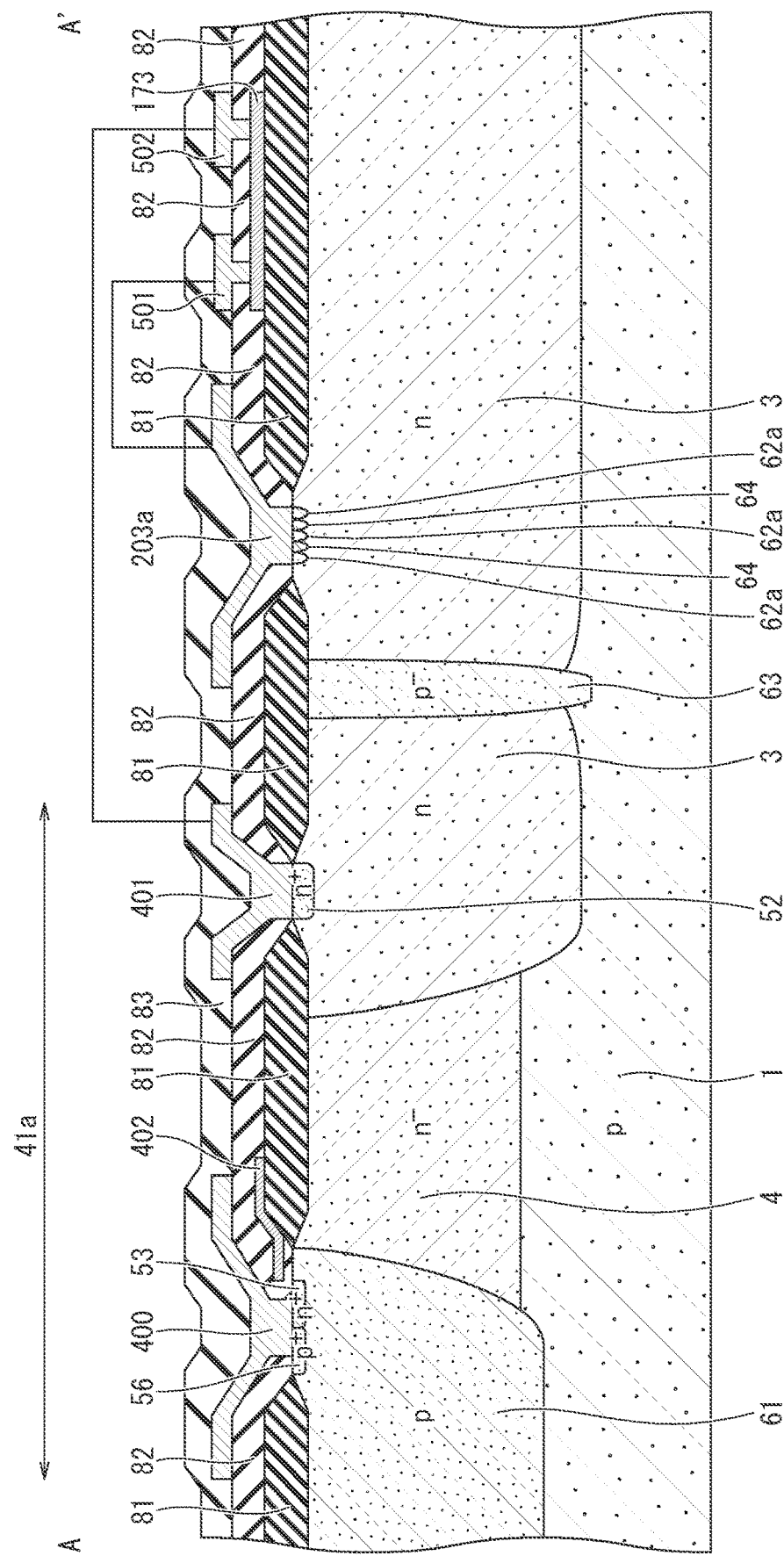
FIG. 14 is a cross-sectional view as viewed from direction A-A' in FIG. 13.

FIG. 13 is a plan view illustrating a main part of a semiconductor device (HVIC) according to a third embodiment of the present invention, and FIG. 14 is a cross-sectional view including the high-voltage n-channel MOS-FET 41a as viewed from direction A-A' in FIG. 13. The HVIC according to the third embodiment of the present invention illustrated in FIG. 13 and FIG. 14 differs from the semiconductor device according to the second embodiment of the present invention illustrated in FIG. 11 in that the drain region 52 of the respective high-voltage n-channel MOSFETs 41a and 41b is not the universal contact region.

The semiconductor device according to the third embodiment of the present invention is provided with the pickup region (62a, 64) of the H-VDD potential that is the universal contact region adjacent to the drain region 52 of the respective high-voltage n-channel MOSFETs 41a and 41b, so as to reduce the number of the hole carriers penetrating through the p-type junction-isolation region 63 and flowing into the body diode 42. The semiconductor device according to the third embodiment of the present invention thus can avoid the operation of the parasitic npn bipolar transistor caused by an inversion recovery phenomenon of the body diode 42 upon the recovery of the Vs potential from the negative surge. This configuration can increase the ON current of the respective high-voltage n-channel MOSFETs 41a and 41b more than the second embodiment.

In the second embodiment and the third embodiment, the pickup region (62a, 64) used as the universal contact region is preferably arranged on the inside of the drain region of the respective high-voltage n-channel MOSFETs 41a and 41b and on the outside of the high-side circuit part (the Vs potential region 200, the H-VDD potential region 201, and the connected region between the Vs potential region 200 and the H-VDD potential region 202) within the high-side circuit region 301 in the planar pattern. The pickup region (62a, 64) is also preferably arranged between the drain region of the respective high-voltage n-channel MOSFETs 41a and 41b and the high-side circuit part in the planar pattern. The pickup region (62a, 64) is also preferably arranged such that a distance to the drain region of the respective high-voltage n-channel MOSFETs 41a and 41b is 100 μm or less in the planar pattern. This configuration can reduce the number of the hole carriers penetrating through the p-type junction-isolation region 63 and flowing into the body diode 42. The semiconductor device thus can suppress the operation of the parasitic npn bipolar transistor caused by an inversion recovery phenomenon of the body diode 42 upon the recovery of the Vs potential from the negative surge.

Fourth Embodiment

Figure 15:
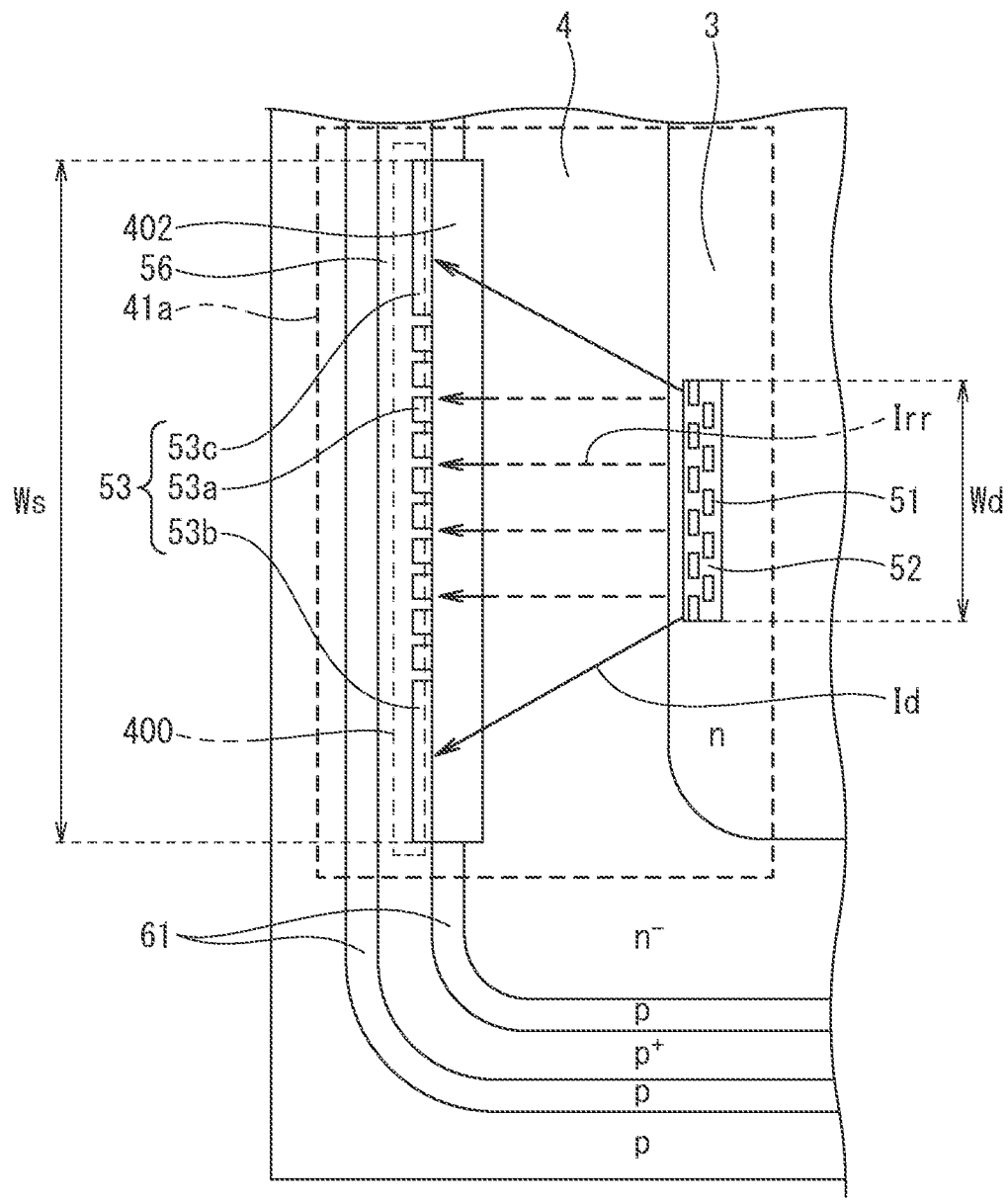
FIG. 15 is a plan view illustrating a circumferential part of a level shifter according to a fourth embodiment of the present invention.

FIG. 15 is a plan view illustrating a circumferential part of the high-voltage n-channel MOSFET 41a in a semiconductor device (HVIC) according to a fourth embodiment of the present invention. The semiconductor device according to the fourth embodiment of the present invention illustrated in FIG. 15 differs from the semiconductor device according to the first embodiment of the present invention illustrated in FIG. 6 in that the density of the n+-type source region 53 in the high-voltage n-channel MOSFET 41a is higher at a position not opposed to the universal contact region (51, 52) than at a position opposed to the universal contact region (51, 52).

As illustrated in FIG. 15, the n+-type source region 53 includes a plurality of opposed regions 53a located at the position opposed to the universal contact region (51, 52), and end regions (projecting regions) 53b and 53c interposing the opposed regions 53a and each located at the position not opposed to the universal contact region (51, 52). The opposed regions 53a each have a rectangular planar pattern, and are arranged separately from and parallel to the universal contact region (51, 52). The end regions 53b and 53c each have a straight planar pattern.

Although not illustrated, the high-voltage n-channel MOSFET 41b illustrated in FIG. 3 has the same structure as the high-voltage n-channel MOSFET 41a illustrated in FIG. 15. The other configurations of the semiconductor device according to the fourth embodiment of the present invention are the same as those of the semiconductor device according to the first embodiment of the present invention, and overlapping explanations are not repeated below.

In the semiconductor device according to the fourth embodiment of the present invention as illustrated in FIG. 15, a drain current Id of the high-voltage n-channel MOSFET 41a is also supplied from the end regions 53b and 53c each located at the position not opposed to the universal contact region (51, 52), so as to ensure the drain current Id necessary for the level-shift circuit operation. The opposed regions 53a, which are arranged at the position opposed to the universal contact region (51, 52) and alternate with the p+-type contact region 56, lead the inversion recovery current Irr upon the inversion recovery to concentrate on the respective opposed regions 53a having low impedance, so as to suppress the operation of the parasitic npn bipolar transistor starting from the voltage drop under the respective opposed regions 53a. Namely, the semiconductor device can avoid the operation of the parasitic npn bipolar transistor upon the inversion recovery while keeping a margin of the level-shift circuit operation.

The semiconductor device according to the fourth embodiment of the present invention described above is provided with the universal contact region (51, 52) serving as the drain region of the high-voltage n-channel MOSFET 41a, but may use the n+-type drain region 52 instead as in the case of the HVIC of the comparative example as illustrated in FIG. 9 and FIG. 10.

Fifth Embodiment

Figure 16:
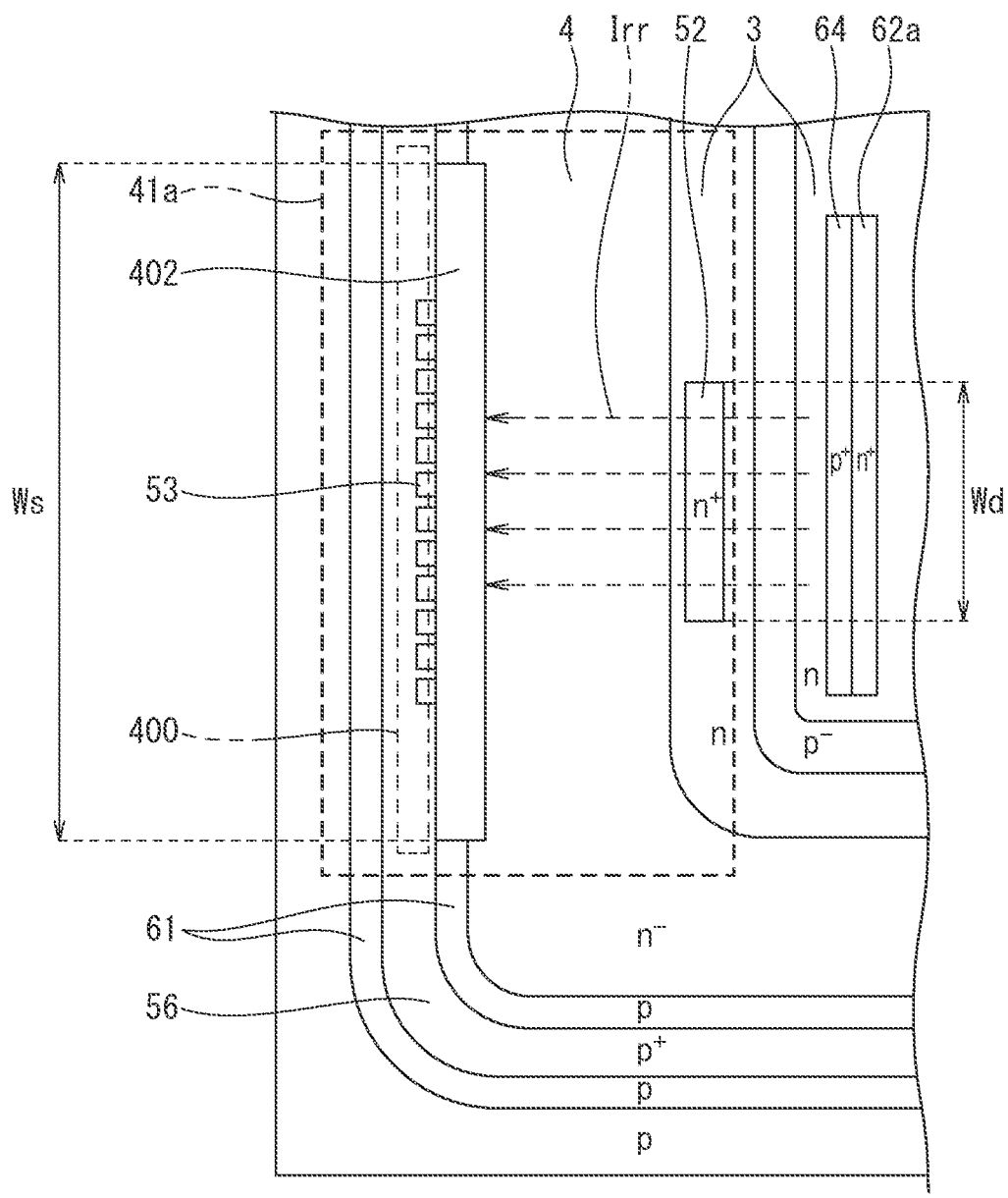
FIG. 16 is a plan view illustrating a semiconductor device according to a fifth embodiment of the present invention.
Figure 17:
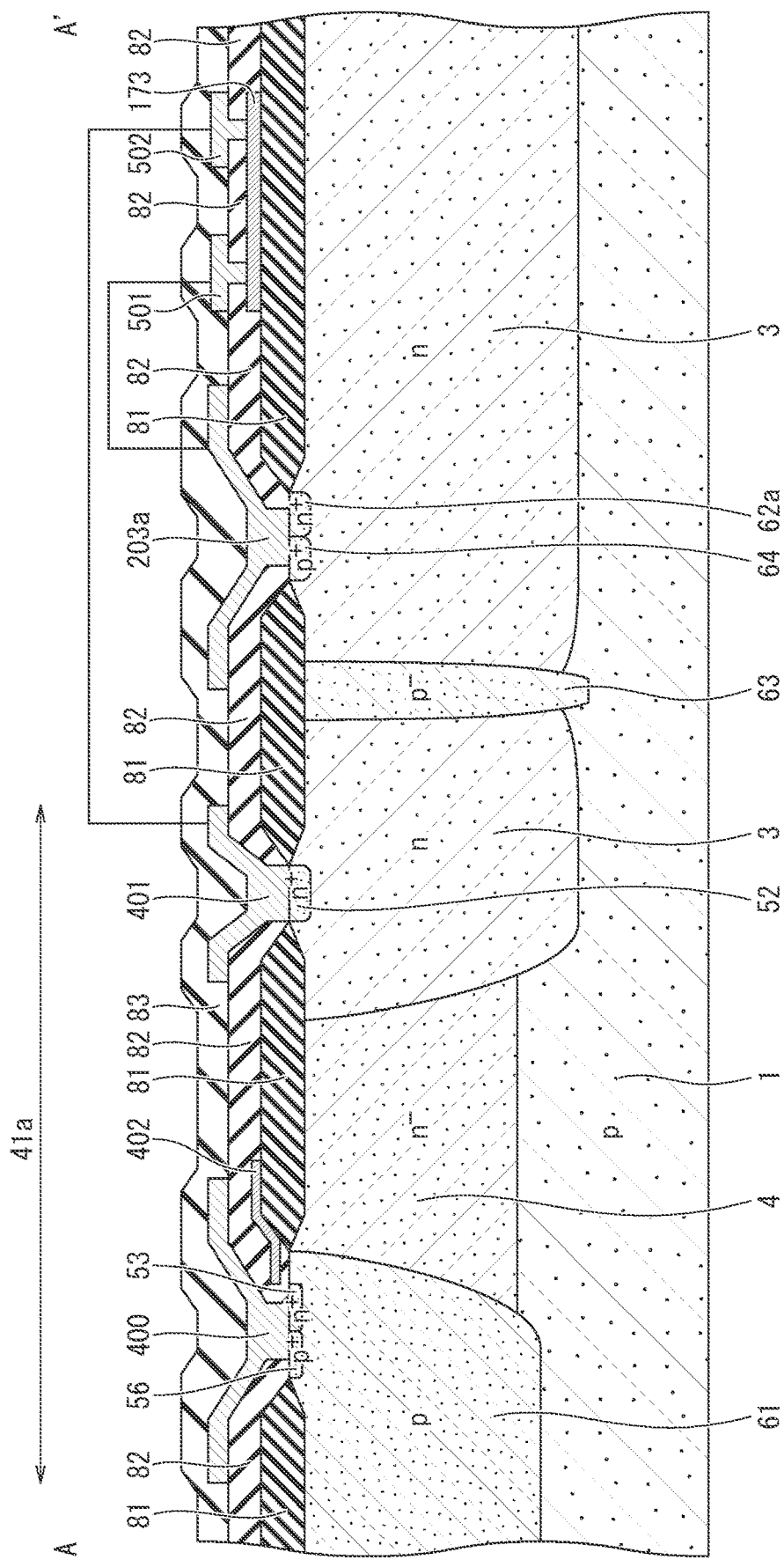
FIG. 17 is a cross-sectional view illustrating the semiconductor device according to the fifth embodiment of the present invention.

FIG. 16 is a plan view illustrating a circumferential part of the high-voltage re-channel MOSFET 41a and the pickup region (62a, 64) in a semiconductor device (HVIC) according to a fifth embodiment of the present invention. FIG. 17 is a cross-sectional view of the semiconductor device according to the fifth embodiment of the present invention, and corresponds to the position as viewed from direction A-A' in FIG. 3.

The semiconductor device according to the fifth embodiment of the present invention illustrated in FIG. 16 and FIG. 17 differs from the semiconductor device according to the first embodiment of the present invention illustrated in FIG. 6 in the structure of the pickup region (62a, 64), and also in using the n+-type contact region 52 as the drain region of the high-voltage n-channel MOSFET 41a.

As illustrated in FIG. 16, the pickup region (62a, 64) includes the n+-type pickup region 62a and the p+-type contact region 64 each extending straight (in a line state) and arranged in contact with each other in the planar pattern. The n+-type pickup region 62a and the p+-type contact region 64 compose the universal contact region.

As illustrated in FIG. 17, the pickup electrode 203a is deposited on and in ohmic contact with the pickup region (62a, 64). The pickup region (62a, 64) and the pickup electrode 203a form a universal contact structure (62a, 64, 203a).

Although not illustrated, the high-voltage n-channel MOSFET 41b illustrated in FIG. 3 has the same structure as the high-voltage n-channel MOSFET 41a illustrated in FIG. 16 and FIG. 17. The other configurations of the semiconductor device according to the fifth embodiment of the present invention are the same as those of the semiconductor device according to the first embodiment of the present invention, and overlapping explanations are not repeated below.

The semiconductor device according to the fifth embodiment of the present invention is provided with the pickup region (62a, 64) of the H-VDD potential that is the universal contact region including the n+-type pickup region 62a and the p+-type contact region 64 each extending in the line state adjacent to the drain region of the respective high-voltage n-channel MOSFETs 41a and 41b, so as to enhance the effect of extracting the hole carriers and reduce the number of the hole carriers penetrating through the p-type junction-isolation region 63 and flowing into the body diode 42.

Sixth Embodiment

Figure 18:
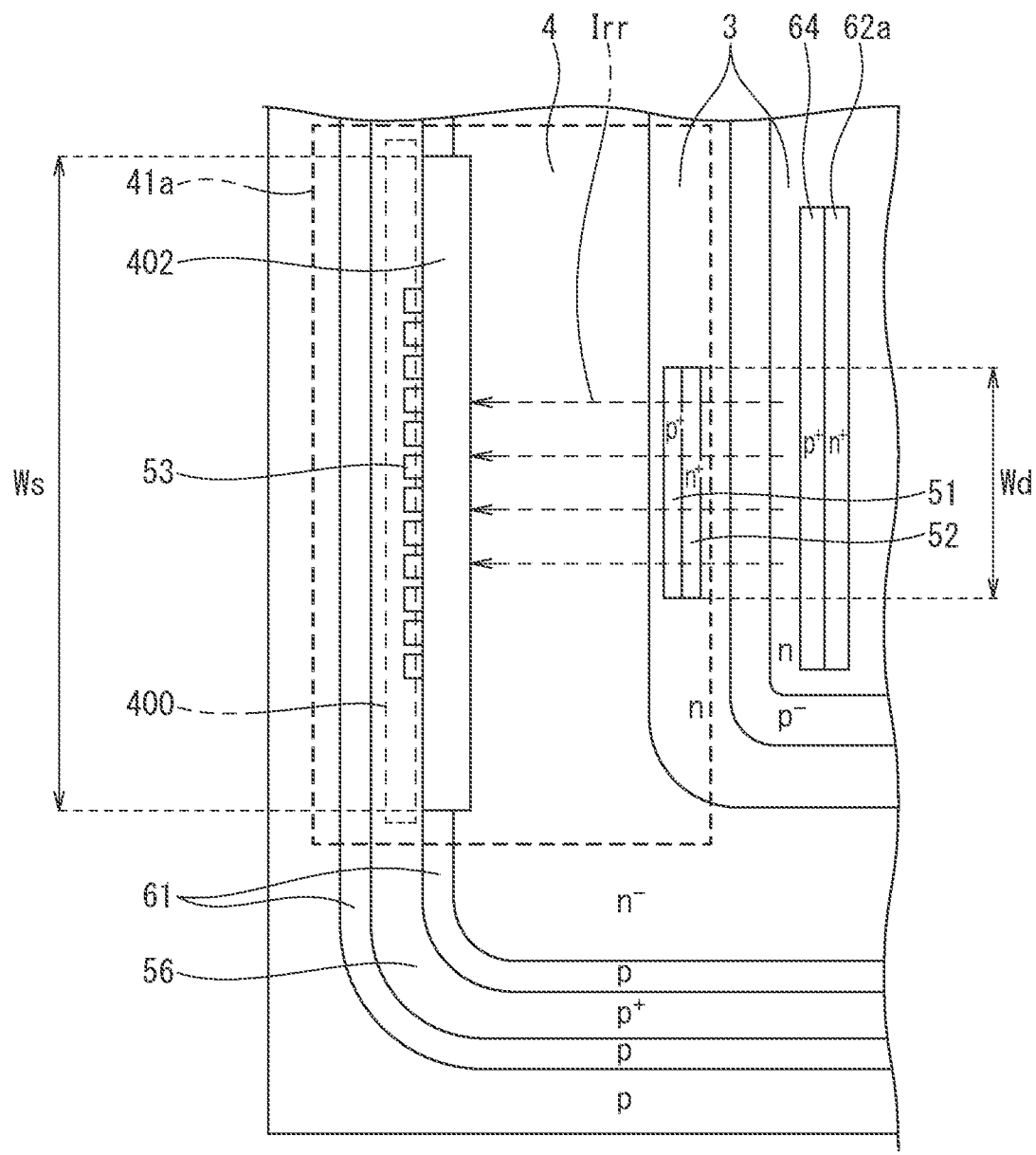
FIG. 18 is a plan view illustrating a semiconductor device according to a sixth embodiment of the present invention.
Figure 19:
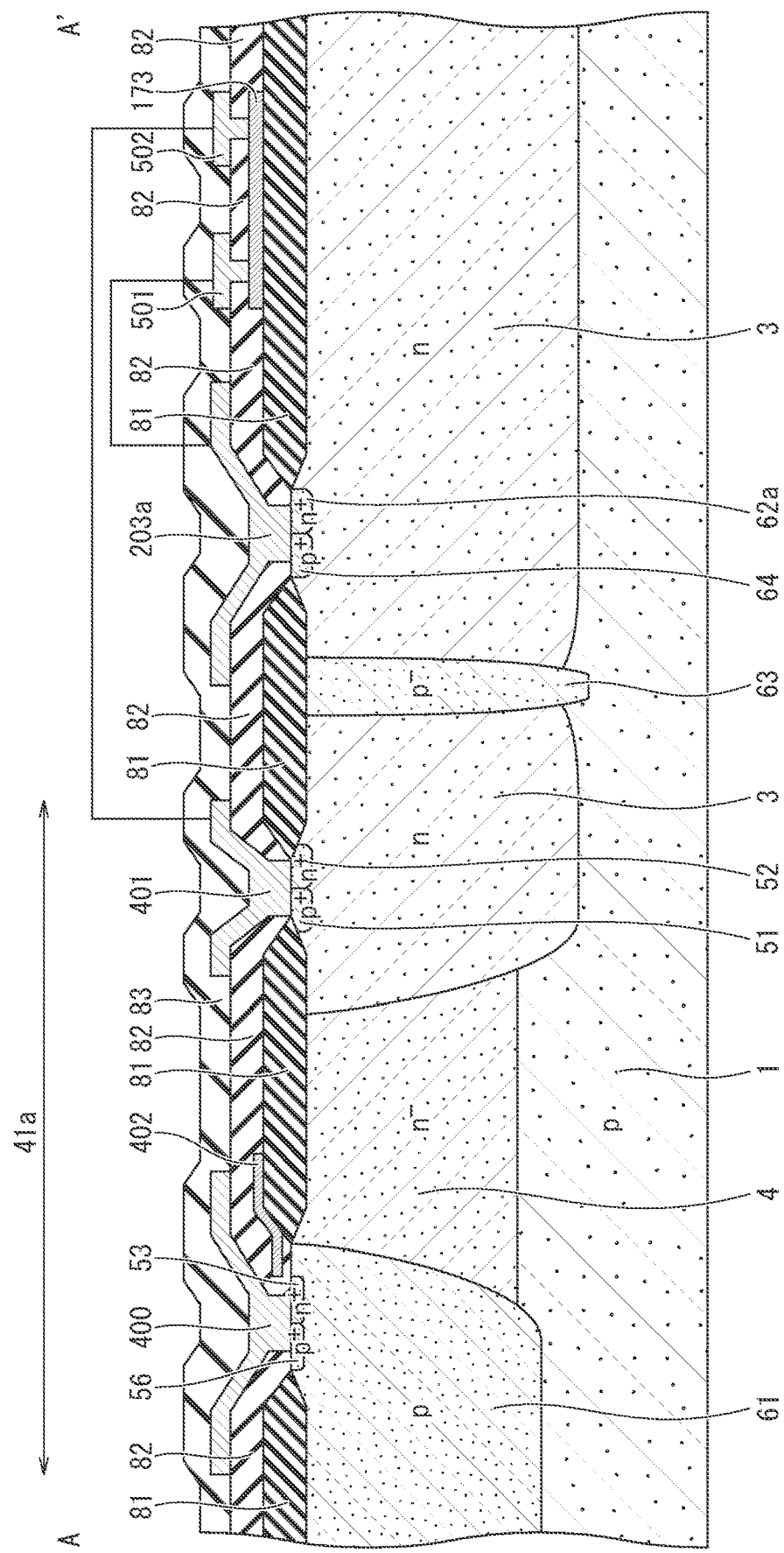
FIG. 19 is a cross-sectional view illustrating the semiconductor device according to the sixth embodiment of the present invention.

FIG. 18 is a plan view illustrating a circumferential part of the high-voltage n-channel MOSFET 41a and the pickup region (62a, 64) in a semiconductor device (HVIC) according to a sixth embodiment of the present invention. FIG. 19 is a cross-sectional view of the semiconductor device according to the sixth embodiment of the present invention, and corresponds to the position as viewed from direction A-A' in FIG. 3.

The semiconductor device according to the sixth embodiment of the present invention illustrated in FIG. 18 and FIG. 19 differs from the semiconductor device according to the fifth embodiment of the present invention illustrated in FIG. 16 and FIG. 17 in using the universal contact region (51, 52) as the drain region of the high-voltage re-channel MOSFET 41a. As illustrated in FIG. 18, the universal contact region (51, 52) includes the p+-type contact region 51 and the n+-type contact region 52 each extending straight (in a line state) in contact with each other in a planar pattern.

As illustrated in FIG. 19, the universal electrode (the universal contact) 401 is deposited on and in ohmic contact with the universal contact region (51, 52). The universal contact region (51, 52) and the universal electrode 401 form a universal contact structure (51, 52, 401).

Although not illustrated, the high-voltage n-channel MOSFET 41b illustrated in FIG. 3 has the same structure as the high-voltage n-channel MOSFET 41a illustrated in FIG. 18 and FIG. 19. The other configurations of the semiconductor device according to the sixth embodiment of the present invention are the same as those of the semiconductor device according to the fifth embodiment of the present invention, and overlapping explanations are not repeated below.

The semiconductor device according to the sixth embodiment of the present invention is provided with the universal contact region (51, 52) serving as the drain region of the high-voltage n-channel MOSFET 41a including the p$^+$-type contact region 51 and the n$^+$-type contact region 52 each extending in the line state, so as to enhance the effect of extracting the hole carriers as minority carriers flowing through the parasitic body diode when the negative surge voltage is applied, and achieve the prompt extraction of the holes from the universal electrode 401.

Seventh Embodiment

Figure 20:
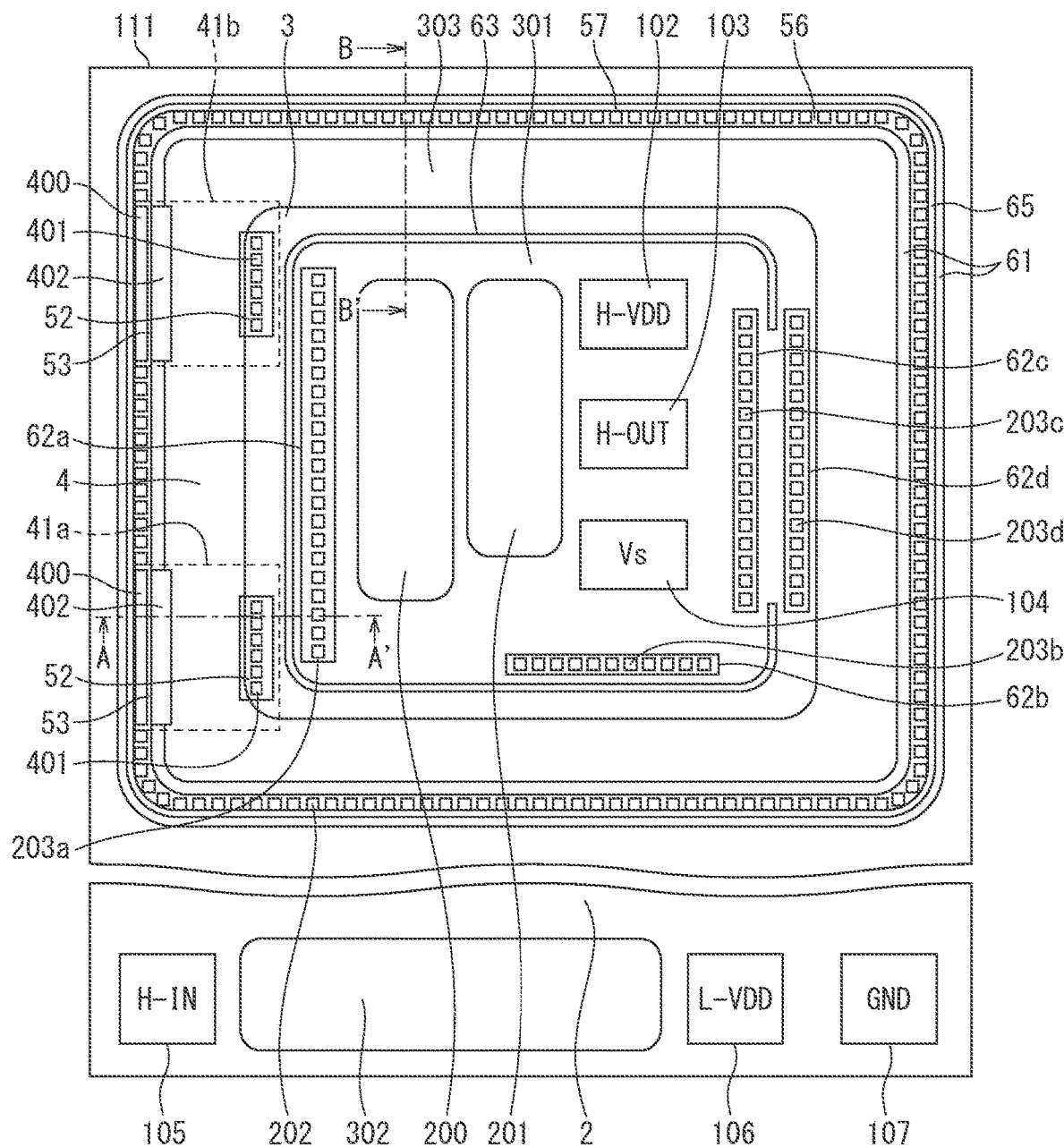
FIG. 20 is a plan view illustrating a semiconductor device according to a seventh embodiment of the present invention.
Figure 21:
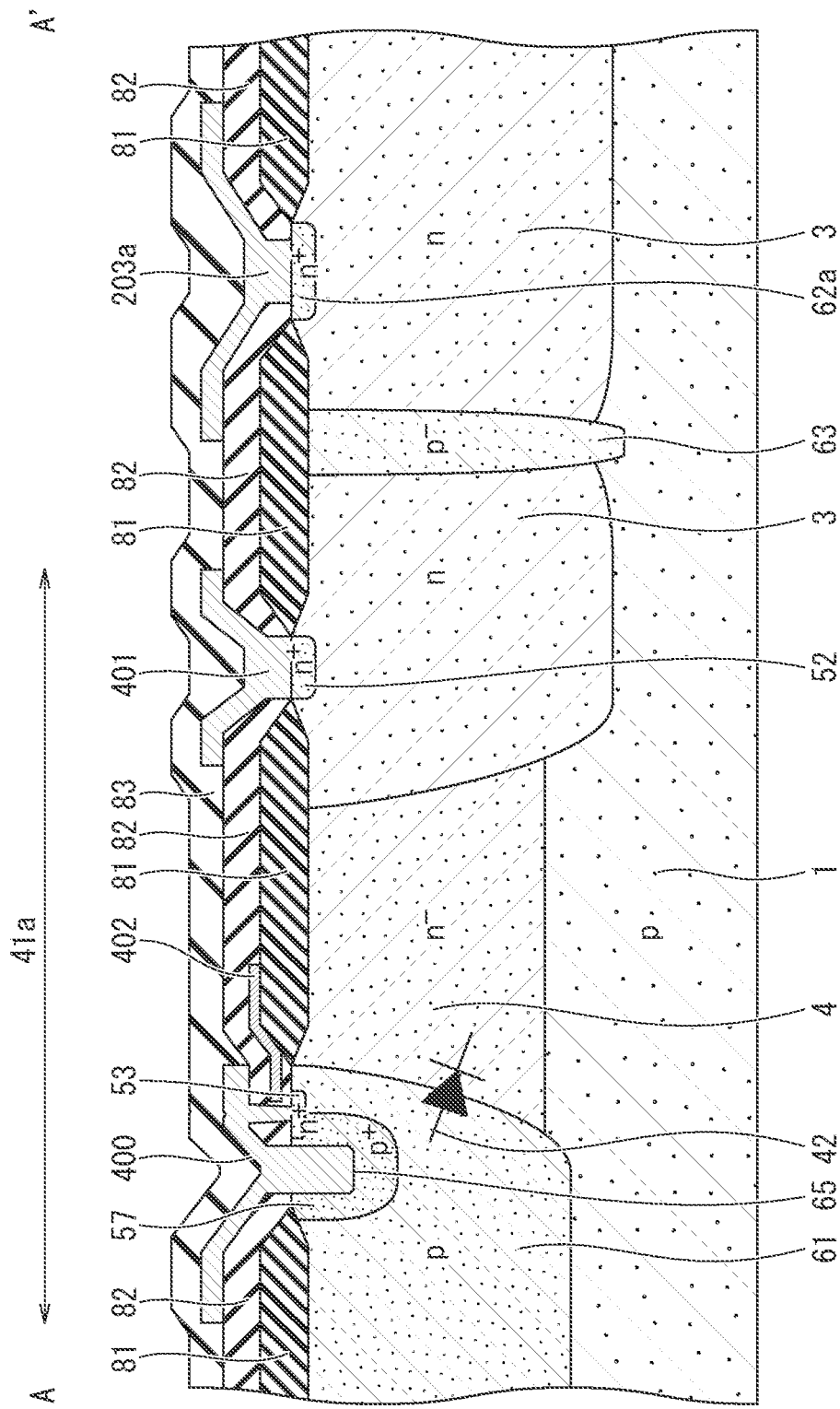
FIG. 21 is a cross-sectional view as viewed from direction A-A' in FIG. 20.

FIG. 20 is a plan view illustrating a main part of a semiconductor device according to a seventh embodiment of the present invention. FIG. 21 is a cross-sectional view including the high-voltage n-channel MOSFET 41a as viewed from direction A-A' in FIG. 20, and FIG. 22 is a cross-sectional view as viewed from direction B-B' in FIG. 20.

Figure 22:
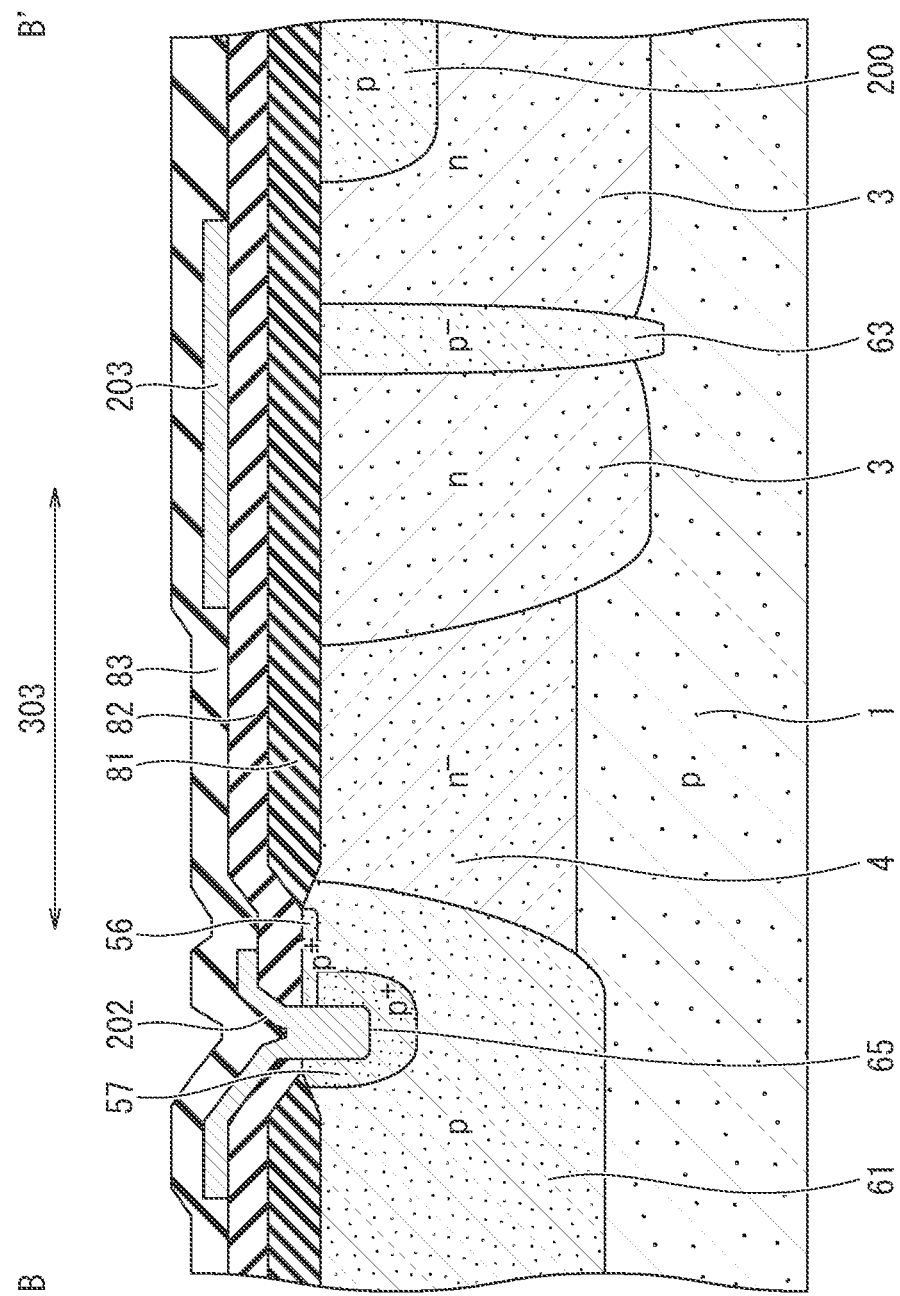
FIG. 22 is a cross-sectional view as viewed from direction B-B' in FIG. 20.

As illustrated in FIG. 20 to FIG. 22, a trench (a groove) 65 is formed into a looped shape on the surface side of the p-type base region 61 on the surface of the p-type semiconductor layer 1. A p$^+$-type trench contact region (a p$^+$-type high-concentration base region) 57 having a higher impurity concentration than the p-type base region 61 is also formed into a looped shape along the side wall of the trench 65. As illustrated in FIG. 20 and FIG. 22, the p$^+$-type trench contact region 57 is connected to the pickup electrode (the pickup contact) 202 connected to the GND potential.

As illustrated in FIG. 21, the p$^+$-type trench contact region 57 is in contact with the side wall and the lower surface of the trench 65 to surround the trench 65 in the high-voltage n-channel MOSFET 41a as viewed from direction A-A' in FIG. 20. The p$^+$-type trench contact region 57 is provided in contact with the side surface and the lower surface of the n$^+$-type source region 53.

The source electrode (the trench contact electrode) 400 is deposited on the p$^+$-type trench contact region 57 and the n$^+$-type source region 53. The source electrode 400 is buried in the trench 65 so as to be in ohmic contact with the p$^+$-type trench contact region 57 along the side wall and the bottom surface of the trench 65. Namely, the source electrode 400 and the pickup electrode (the pickup contact) 202 connected to the GND potential are short-circuited at the same potential. The source electrode 400 is also in ohmic contact with the n$^+$-type source region 53 via a contact.

The p$^+$-type trench contact region 57 is formed by use of a mask for ion implantation independently of the pickup region 202 connected to the GND potential or the p$^+$-type contact region 56 used as a source-drain region of the p-channel MOSFET implementing the logic circuit, which is typically formed in a flat active region. For example, the trench 65 is dug in a region in which the p$^+$-type trench contact region 5 is formed after a polysilicon pattern is formed, a buffer oxidation film is deposited, and impurity ions of boron ($^{11}$B) are then implanted at a high concentration by four-divided oblique ion implantation by use of a mask for ion implantation for the trench 65. Thereafter, the p$^+$-type contact region 56 used as a source-drain region of the p-channel MOSFET and the n$^+$-type contact regions 52 and 53 used as a source-drain region of the high-voltage n-channel MOSFET 41a implementing the logic circuit are selectively formed. The use of boron ($^{11}$B) as impurity ions for the ion implantation can diffuse the p$^+$-type trench contact region 57 more deeply than the n$^+$-type contact region 52 typically formed by use of arsenic ($^{75}$As), and form the p$^+$-type trench contact region 57 not only along the side wall of the trench 65 but also in the lateral direction so as to further extend below the n$^+$-type source region 53 of the high-voltage n-channel MOSFET 41a.

Although not illustrated, the high-voltage n-channel MOSFET 41b illustrated in FIG. 20 has the same structure as the high-voltage n-channel MOSFET 41a illustrated in FIG. 21. The other configurations of the semiconductor device according to the seventh embodiment of the present invention are the same as those of the semiconductor device according to the first embodiment of the present invention, and overlapping explanations are not repeated below.

The semiconductor device according to the seventh embodiment of the present invention, which includes the p$^+$-type trench contact region (the high-concentration base region) 57 in contact with the lower surface of the n$^+$-type source region 53 of the high-voltage n-channel MOSFET 41a, causes a forward current of the parasitic body diode 42 to excessively flow from the GND terminal toward the H-VDD terminal when the negative surge voltage is applied to the H-VDD terminal (for example, the pickup electrode 203a connected to the H-VDD terminal) via the Vs terminal 110. The parasitic body diode 42 is then led to the inversion recovery state when the Vs potential is recovered and the voltage of the H-VDD potential is also returned.

Figure 23:
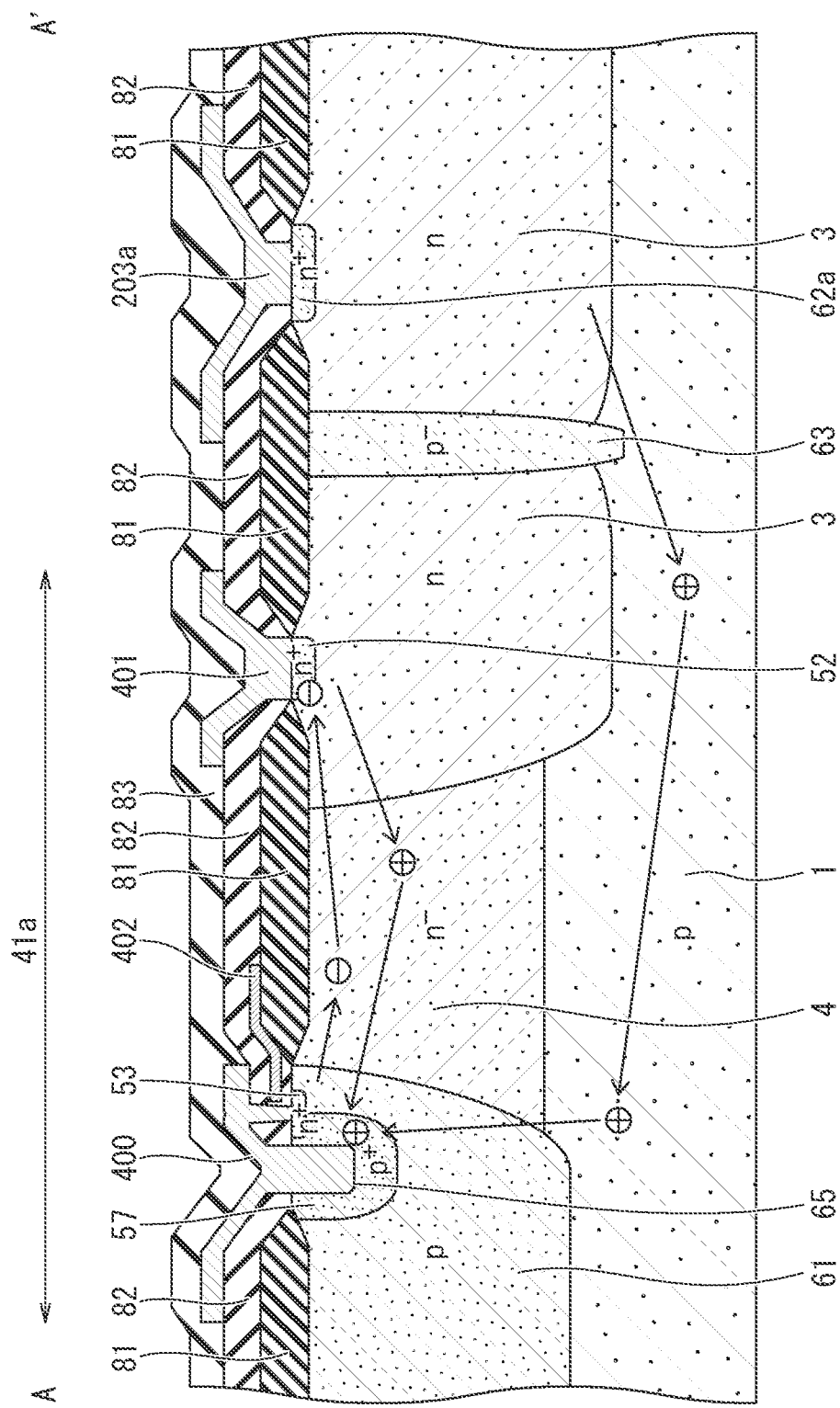
FIG. 23 is a cross-sectional view illustrating a behavior of electrons and holes upon inversion recovery after a negative surge voltage is applied in the semiconductor device according to the seventh embodiment of the present invention.

While the holes as the minority carriers excessively flow below the n$^+$-type source region 53 via the p-type semiconductor layer 1 and the n$^-$-type breakdown voltage region 4, as illustrated in FIG. 23, the presence of the extraction structure of the p$^+$-type trench contact region 57 at the front stage can immediately extract the holes. This can prevent a voltage drop of 0.6 volts or greater in the p-type base region 61 under the n$^+$-type source region 53 if the Vs potential is recovered and the excessive inversion recovery current Irr (the hole current) of the body diode 42 flows in, and avoid the operation of the parasitic npn bipolar transistor including the n$^+$-type source region 53, the p-type base region 61, and the n$^-$-type breakdown voltage region 4, so as to suppress an error operation of the level-shift circuit or damage by thermal runaway caused by the parasitic operation.

The structure of the semiconductor device according to the seventh embodiment of the present invention including the p$^+$-type trench contact region (the p$^+$-type high-concentration base region) 57 in contact with the trench 65 and the source electrode (the trench contact electrode) 400 buried in the trench 65 can also be applied to the semiconductor device according to the fourth embodiment of the present invention illustrated in FIG. 15 in which the density of the n$^+$-type source region 53 is higher at the position not opposed to the universal contact region (51, 52) than at the position opposed to the universal contact region (51, 52).

Eighth Embodiment

Figure 24:
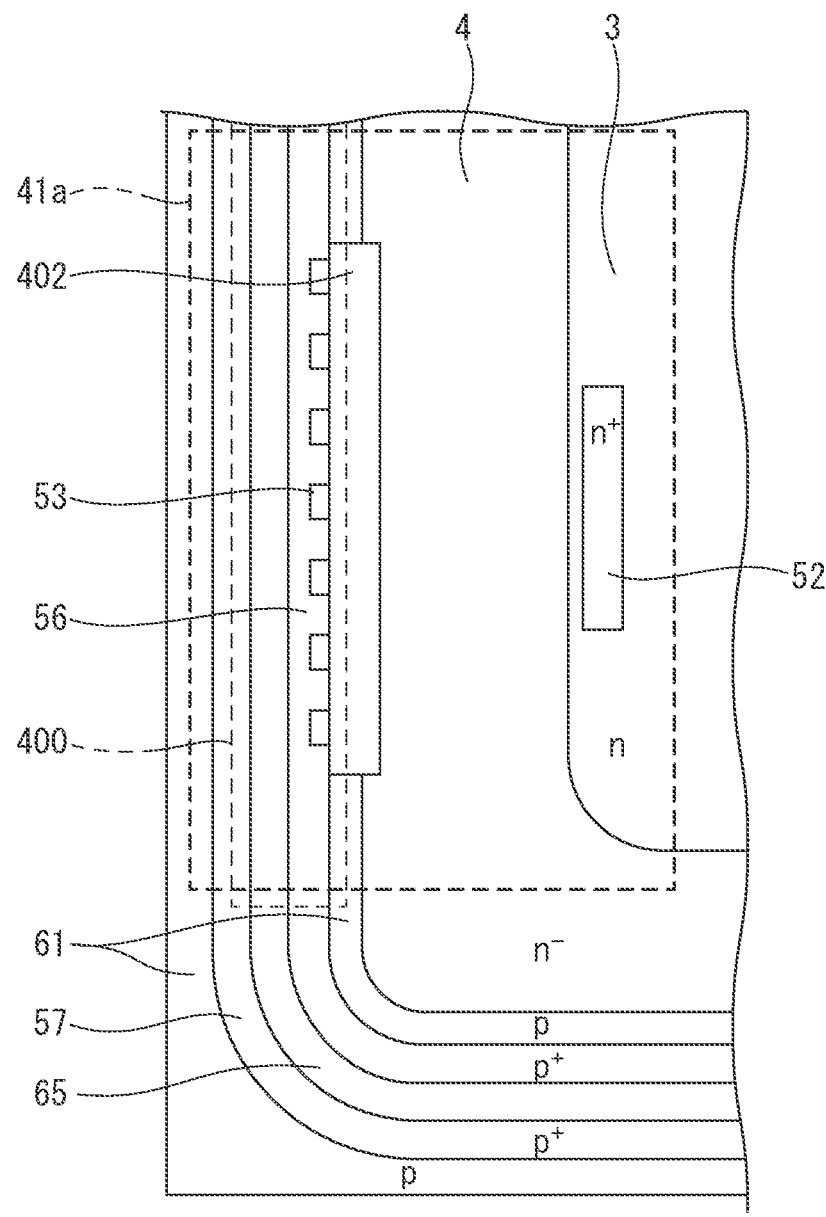
FIG. 24 is a plan view illustrating a circumferential part of a level shifter according to an eighth embodiment of the present invention.

FIG. 24 is a plan view illustrating the high-voltage n-channel MOSFET 41a in a semiconductor device (HVIC)

according to an eighth embodiment of the present invention. In the semiconductor device according to the seventh embodiment of the present invention described above, the p$^+$-type region having a high concentration is preferably expanded under the n$^+$-type source region 53 so as to enhance the effect of extracting the hole carriers by the body diode 42 of the high-voltage n-channel MOSFET 41a in the n$^-$-type breakdown voltage region 4 and the n-type well region 3 during the period in which the negative surge voltage is applied to the Vs terminal 110.

However, a source contact resistance may be increased in the high-voltage re-channel MOSFET 41a to cause a significant decrease in ON current or an increase in threshold voltage if the p$^+$-type trench contact region 57 is excessively expanded because of an excessive dose of implanted ions or ion implantation of high-acceleration voltage or if the width of the n$^+$-type contact region (the n$^+$-type source region) 53 is excessively narrowed in order to cover the entire region under the n$^+$-type contact region 53 with the p$^+$-type trench contact region 57.

To avoid such a problem, the semiconductor device according to the eighth embodiment of the present invention has a structure in which the n$^+$-type source region 53 is not arranged in a line state but divided into small pieces so as to interpose the p$^+$-type contact region 56 between the divided n$^+$-type source regions 53, as illustrated in FIG. 24. The number, the size, and the gaps of the divided n$^+$-type source regions 53 may be determined as appropriate. The contact of the source electrode 400 is arranged across the n$^+$-type source regions 53 and the p$^+$-type contact region 56.

Although not illustrated, the high-voltage n-channel MOSFET 41b has the same structure as the high-voltage n-channel MOSFET 41a illustrated in FIG. 24. The other configurations of the semiconductor device according to the eighth embodiment of the present invention are the same as those of the semiconductor device according to the seventh embodiment of the present invention, and overlapping explanations are not repeated below.

The semiconductor device according to the eighth embodiment of the present invention can absorb the holes as the minority carriers also in the p$^+$-type contact region 56 interposed between the n$^+$-type source regions 53, so as to suppress an increase in base resistance and avoid the operation of the parasitic npn bipolar transistor without covering the entire region under the n$^+$-type contact regions 53 with the p$^+$-type trench contact region 57.

In the process of manufacturing the respective semiconductor devices according to the seventh embodiment and the eighth embodiment of the present invention, the n$^-$-type breakdown voltage region 4, the n-type well region 3, the p-type base region 61, and the p-type junction-isolation region 63 are formed such that n-type impurity ions such as phosphorus or p-type impurity ions such as boron are implanted through a delineating step, and are then diffused to a predetermined diffusion depth at a high temperature (such as about 1100° C. to 1200° C.) in a diffusion step. The Vs potential region 200 provided in the high-side circuit part and the well region in the low-side circuit part, for example, are formed such that impurity ions are diffused into a predetermined diffusion depth in a diffusion step independent of the diffusion step for forming the n$^-$-type breakdown voltage region 4, the n-type well region 3, the p-type base region 61, and the p-type junction-isolation region 63 at a high temperature (such as about 1100° C. to 1200° C.).

The respective n$^+$-type pickup regions 62 are formed such that n-type impurity ions such as arsenic are implanted to a predetermined depth so as to have a surface concentration of about $1 \times 10^{20}$/cm$^3$, and are then subjected to annealing at a temperature of about 750° C. to 900° C. The n$^+$-type source regions 53 and the n$^+$-type contact region 52 in the high-voltage n-channel MOSFET 41a are also formed by the ion implantation and the annealing as in the case of the n$^+$-type pickup regions 62.

The p$^+$-type contact region 56 is formed such that ions such as BF$_2$ are implanted to a predetermined diffusion depth so as to have a surface concentration of about $1 \times 10^{20}$/cm$^3$ through a delineating step for p$^+$-region forming, and are then subjected to annealing at the same temperature of about 750° C. to 900° C. as in the annealing step executed for the respective n$^+$-type pickup regions 62.

The p$^+$-type trench contact region 57 is formed such that the trench 65 is dug by dry etching in the region adjacent to the n$^+$-type source regions 53 at a depth of about 0.5 μm to 5.0 μm and a width of about 0.5 μm to 5.0 μm after a polysilicon pattern is formed, a buffer oxidation film is deposited, and impurity ions of boron (B11) are implanted to a predetermined diffusion depth by four-divided oblique ion implantation by use of a mask for ion implantation for the trench groove region so as to have a concentration of about $1 \times 10^{19}$ to $1 \times 10^{20}$/cm$^3$ at the side wall of the trench, and are then subjected to annealing at the same temperature of about 750° C. to 900° C. as in the annealing step executed for the respective n$^+$-type pickup regions 62 and the p$^+$-type contact region 56. The ion implantation of zero degrees may also be used simultaneously so that the impurity ions of boron are also implanted to the bottom surface of the trench during the four-divided oblique ion implantation.

Ninth Embodiment

FIG. 25 is a cross-sectional view illustrating a semiconductor device (HVIC) according to a ninth embodiment of the present invention, and corresponds to the cross section of the semiconductor device according to the seventh embodiment of the present invention illustrated in FIG. 21. The semiconductor device according to the ninth embodiment of the present invention illustrated in FIG. 25 is common to the semiconductor device according to the seventh embodiment of the present invention illustrated in FIG. 21 in including the p$^+$-type trench contact region (the p$^+$-type high-concentration base region) 57 in contact with the trench 65 and the source electrode (the trench contact electrode) 400 buried in the trench 65.

The semiconductor device according to the ninth embodiment of the present invention differs from the semiconductor device according to the seventh embodiment of the present invention illustrated in FIG. 21 in that the high-voltage n-channel MOSFET 41a includes the universal contact region (51, 52) serving as the drain region provided on the surface layer of the n-type well region 3. The universal contact region (51, 52) includes the p$^+$-type contact regions 51 and the n$^+$-type contact region 52 alternately arranged in contact with each other along the surface of the p-type semiconductor layer 1.

The semiconductor device according to the ninth embodiment of the present invention also differs from the semiconductor device according to the seventh embodiment of the present invention illustrated in FIG. 21 in that the contact of the pickup region (62a, 64) adjacent to the drain region of the high-voltage n-channel MOSFET 41a is the universal contact region. The pickup region (62a, 64) includes the n$^+$-type pickup region 62a and the p$^+$-type contact regions 64 alternately arranged in contact with each other to form the universal contact region along the surface of the p-type semiconductor layer 1, as illustrated in FIG. 11 and FIG. 12.

Although not illustrated, the high-voltage n-channel MOSFET 41b has the same structure as the high-voltage n-channel MOSFET 41a illustrated in FIG. 25. The other configurations of the semiconductor device according to the ninth embodiment of the present invention are the same as those of the semiconductor device according to the seventh embodiment of the present invention, and overlapping explanations are not repeated below.

The semiconductor device according to the ninth embodiment of the present invention achieves the same effects as the semiconductor device according to the seventh embodiment of the present invention. The semiconductor device according to the ninth embodiment of the present invention is provided with the universal contact region (51, 52) serving as the drain region of the respective high-voltage n-channel MOSFETs 41a and 41b, so as to efficiently extract the hole carriers in the p$^+$-type contact regions 51 of the respective universal contact regions (51, 52) by the body diode current flowing when the negative surge voltage is input to the Vs terminal 110, reducing remaining carriers accordingly. The semiconductor device according to the ninth embodiment of the present invention thus can reduce the inversion recovery current Irr (the hole current) when the Vs potential is recovered, and suppress the operation of the parasitic npn bipolar transistor using the inversion recovery current Irr as a trigger.

The semiconductor device according to the ninth embodiment of the present invention is also provided with the pickup region (62a, 64) of the H-VDD potential that is the universal contact region adjacent to the drain region 52 of the respective high-voltage n-channel MOSFETs 41a and 41b, so as to reduce the number of the hole carriers penetrating through the p-type junction-isolation region 63 and flowing into the body diode 42. The semiconductor device according to the ninth embodiment of the present invention thus can suppress the operation of the parasitic npn bipolar transistor caused by the inversion recovery phenomenon of the body diode 42 when the Vs potential is recovered from the negative surge.

Other Embodiments

While the present invention has been described above by reference to the first to ninth embodiments, it should be understood that the present invention is not intended to be limited to the descriptions and the drawings composing part of this disclosure. Various alternative embodiments, examples, and technical applications will be apparent to those skilled in the art according to this disclosure.

While the semiconductor devices according to the first to ninth embodiments are each illustrated above with the structure in which the n-type diffusion layer such as the n-type well region 3 is formed on the surface layer of the p-type semiconductor layer 1, the present invention is not limited to this structure. For example, a structure in which an n-type epitaxially-grown layer is grown on the p-type semiconductor layer 1 can also achieve the similar effects. A structure in which a p-type epitaxially-grown layer is grown on the p-type semiconductor layer 1 and an n-type buried layer is provided at a joint part between the p-type epitaxially-grown layer and the p-type semiconductor layer 1 can also achieve the similar effects.

While the semiconductor devices according to the first to ninth embodiments are each illustrated above with the structure in which the respective high-voltage n-channel MOSFETs 41a and 41b are provided on the same side of the HVJT 303 having the loop-shaped planar pattern, the present invention is not limited to this structure. For example, the respective high-voltage n-channel MOSFETs 41a and 41b may be arranged on the different sides opposed to each other in the loop-shaped planar pattern of the HVJT 303. When this structure is applied to the second embodiment, the contact of the pickup region closest to the drain region of the respective high-voltage n-channel MOSFETs 41a and 41b can be composed of the universal contact region.

While the semiconductor devices according to the first to ninth embodiments are each illustrated above with the HVIC, the present invention can be applied to any semiconductor device other than the HVIC. The present invention is particularly effectively applied to a semiconductor device to which a high voltage of several tens of volts is applied, for example.

What is claimed is:

1. A semiconductor device including a high-potential-side circuit region, a high-voltage junction termination structure arranged along a circumference of the high-potential-side circuit region, and a low-potential-side circuit region arranged at a circumference of the high-potential-side circuit region via the high-voltage junction termination structure that are integrated in a single semiconductor chip, the semiconductor device comprising:
    a semiconductor layer of a first conductivity-type;
    a well region of a second conductivity-type located in the high-potential-side circuit region and deposited on a surface layer of the semiconductor layer;
    a breakdown voltage region of the second conductivity-type arranged in contact with the well region to surround the well region and having a lower impurity concentration than the well region;
    a base region of the first conductivity-type arranged in contact with the breakdown voltage region to surround the breakdown voltage region;
    a carrier supply region of the second conductivity-type arranged on a surface layer of the base region and serving as a level shifter included in a level-shift circuit that transfers signals between the low-potential-side circuit region and the high-potential-side circuit region;
    a carrier reception region of the level shifter arranged on a surface layer of the well region or the breakdown voltage region; and
    a plurality of pickup regions arranged on the surface layer of the well region,
    wherein the carrier reception region is formed of a universal contact region including a region of the first conductivity-type and a region of the second conductivity-type arranged in contact with each other,
    wherein one pickup region of the plurality of pickup regions is electrically connected to the carrier reception region via a resistor.

2. The semiconductor device of claim 1, wherein the universal contact region is a first universal contact region,
    wherein the one pickup region of the plurality of pickup regions is formed of a second universal contact region including a region of the first conductivity-type and a region of the second conductivity-type arranged in contact with each other.

3. The semiconductor device of claim 2, wherein the second universal contact region is the one pickup region of the plurality of pickup regions arranged outside a circuit part in the high-potential-side circuit region and inside the carrier reception region in a planar pattern.

4. The semiconductor device of claim 2, wherein the second universal contact region is the one pickup region of the plurality of pickup regions arranged closest to the carrier reception region.

5. The semiconductor device of claim 2, wherein the second universal contact region is the one pickup region of the plurality of pickup regions arranged closest to the carrier reception region and having a distance to the carrier reception region that is 100 μm or less.

6. The semiconductor device of claim 3, wherein the second universal contact region is the one pickup region of the plurality of pickup regions arranged between the circuit part in the high-potential-side circuit region and the carrier reception region in the planar pattern.

7. The semiconductor device of claim 1, wherein:
the carrier supply region and the carrier reception region are arranged parallel to each other in a planar pattern; and
the carrier supply region in a longitudinal direction has a wider width than the carrier reception region in a longitudinal direction, in the planar pattern.

8. The semiconductor device of claim 7, wherein a density of the carrier supply region is lower at a position opposed to the carrier reception region than at a position not opposed to the carrier reception region.

9. The semiconductor device of claim 1, further comprising a junction-isolation region of the first conductivity-type penetrating the well region to reach the semiconductor layer.

10. The semiconductor device of claim 1, further comprising:
a high-concentration base region of the first conductivity-type arranged in contact with a side wall of a trench provided on the surface layer of the base region and in contact with the carrier supply region, and having a higher impurity concentration than the base region; and
a trench contact electrode buried in the trench to be in ohmic contact with the high-concentration base region.

11. The semiconductor device of claim 10, wherein the high-concentration base region is in contact with a lower surface of the carrier supply region.

12. The semiconductor device of claim 10, wherein the high-concentration base region is in contact with a bottom surface of the trench.

13. A semiconductor device including a high-potential-side circuit region, a high-voltage junction termination structure arranged along a circumference of the high-potential-side circuit region, and a low-potential-side circuit region arranged at a circumference of the high-potential-side circuit region via the high-voltage junction termination structure that are integrated in a single semiconductor chip, the semiconductor device comprising:
a semiconductor layer of a first conductivity-type;
a well region of a second conductivity-type located in the high-potential-side circuit region and deposited on a surface layer of the semiconductor layer;
a breakdown voltage region of the second conductivity-type arranged in contact with the well region to surround the well region and having a lower impurity concentration than the well region;
a base region of the first conductivity-type arranged in contact with the breakdown voltage region to surround the breakdown voltage region;
a carrier supply region of the second conductivity-type arranged on a surface layer of the base region and serving as a level shifter included in a level-shift circuit that transfers signals between the low-potential-side circuit region and the high-potential-side circuit region;

a carrier reception region of the level shifter arranged on a surface layer of the well region or the breakdown voltage region; and
a plurality of pickup regions arranged on the surface layer of the well region,
wherein one pickup region of the plurality of pickup regions is formed of a universal contact region including a region of the first conductivity-type and a region of the second conductivity-type arranged in contact with each other,
wherein the universal contact region is the one pickup region of the plurality of pickup regions arranged closest to the carrier reception region and having a distance to the carrier reception region that is 100 μm or less.

14. The semiconductor device of claim 13, wherein the universal contact region is the one pickup region of the plurality of pickup regions arranged outside a circuit part in the high-potential-side circuit region and inside the carrier reception region in a planar patter.

15. The semiconductor device of claim 13, wherein the universal contact region is the one pickup region of the plurality of pickup regions arranged closest to the carrier reception region.

16. The semiconductor device of claim 14, wherein the universal contact region is the one pickup region of the plurality of pickup regions arranged between the circuit part in the high-potential-side circuit region and the carrier reception region in a planar pattern.

17. The semiconductor device of claim 13, further comprising:
a high-concentration base region of the first conductivity-type arranged in contact with a side wall of a trench provided on the surface layer of the base region and in contact with the carrier supply region, and having a higher impurity concentration than the base region; and
a trench contact electrode buried in the trench to be in ohmic contact with the high-concentration base region.

18. A semiconductor device including a high-potential-side circuit region, a high-voltage junction termination structure arranged along a circumference of the high-potential-side circuit region, and a low-potential-side circuit region arranged at a circumference of the high-potential-side circuit region via the high-voltage junction termination structure that are integrated in a single semiconductor chip, the semiconductor device comprising:
a semiconductor layer of a first conductivity-type;
a well region of a second conductivity-type located in the high-potential-side circuit region and deposited on a surface layer of the semiconductor layer;
a breakdown voltage region of the second conductivity-type arranged in contact with the well region to surround the well region and having a lower impurity concentration than the well region;
a base region of the first conductivity-type arranged in contact with the breakdown voltage region to surround the breakdown voltage region;
a carrier supply region of the second conductivity-type arranged on a surface layer of the base region and serving as a level shifter included in a level-shift circuit that transfers signals between the low-potential-side circuit region and the high-potential-side circuit region; and
a carrier reception region of the level shifter arranged on a surface layer of the well region or the breakdown voltage region, wherein the carrier supply region and the carrier reception region are arranged parallel to each other in a planar pattern,
the carrier supply region has a wider width than the carrier reception region, and
a density of the carrier supply region is lower at a position opposed to the carrier reception region than at a position not opposed to the carrier reception region.

\* \* \* \* \*